US012532410B2

(12) United States Patent
Jeong et al.

(10) Patent No.: US 12,532,410 B2
(45) Date of Patent: Jan. 20, 2026

(54) ELECTRONIC DEVICE COMPRISING SEALING MEMBER

(71) Applicant: Samsung Electronics Co., Ltd., Suwon-si (KR)

(72) Inventors: Seongki Jeong, Suwon-si (KR); Jingook Kim, Suwon-si (KR); Chijoon Kim, Suwon-si (KR); Seungwhee Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 159 days.

(21) Appl. No.: 18/458,457

(22) Filed: Aug. 30, 2023

(65) Prior Publication Data

US 2023/0413427 A1    Dec. 21, 2023

Related U.S. Application Data

(63) Continuation of application No. PCT/KR2022/002767, filed on Feb. 25, 2022.

(30) Foreign Application Priority Data

Mar. 9, 2021  (KR) .................. 10-2021-0031018

(51) Int. Cl.
  *H05K 1/02*        (2006.01)
  *G06F 1/16*        (2006.01)
  (Continued)

(52) U.S. Cl.
  CPC .......... *H05K 1/028* (2013.01); *G06F 1/1652* (2013.01); *H05K 1/181* (2013.01); *H05K 3/4038* (2013.01);
  (Continued)

(58) Field of Classification Search
  CPC ............... H05K 1/028; H05K 2201/05; H05K 2201/10128; H05K 2203/1147; H05K 5/061; H05K 1/147
  See application file for complete search history.

(56) References Cited

U.S. PATENT DOCUMENTS 7,466,558 B2 *  12/2008  Yasuda .............. H04M 1/0216
                                                   361/755
8,625,290 B2 *   1/2014  Wee ..................... H05K 5/069
                                                   174/152 G (Continued)

FOREIGN PATENT DOCUMENTS

CN       10-8512971 A    9/2018
CN       110167304 A     8/2019
                (Continued)

OTHER PUBLICATIONS

International Search Report dated Jun. 7, 2022, issued in International Patent Application No. PCT/KR2022/002767.
(Continued)

*Primary Examiner* — Sherman Ng
(74) *Attorney, Agent, or Firm* — Jefferson IP Law, LLP

(57) ABSTRACT

An electronic device is provided. The electronic device includes a hinge, a first housing having at least a portion coupled to a first side of the hinge and including a first substrate assembly, a second housing having at least a portion coupled to a second side of the hinge, including a second substrate assembly, and configured to be foldable and unfoldable, a flexible display supported on the first and second housing and configured to be foldable and unfoldable, an FPCB electrically connecting the first and second substrate assembly, a through hole formed in the first housing forming a path through which the at least one FPCB passes, a first sealing member disposed so as to compress a first side surface of the at least one FPCB disposed in the
(Continued)

through hole, and a second sealing member presses the second side surface of the FPCB disposed in the through hole.

14 Claims, 24 Drawing Sheets

(51) Int. Cl.
    *H05K 1/18*     (2006.01)
    *H05K 3/40*     (2006.01)
    *H05K 5/00*     (2006.01)

(52) U.S. Cl.
    CPC ... *H05K 5/0026* (2013.01); *H05K 2201/0137* (2013.01); *H05K 2201/05* (2013.01); *H05K 2201/10128* (2013.01); *H05K 2203/1147* (2013.01)

(56) References Cited

U.S. PATENT DOCUMENTS

| | | |
|---|---|---|
| 10,528,086 B2 | 1/2020 | Chung |
| 2002/0079653 A1 | 6/2002 | Noguchi et al. |
| 2009/0101384 A1 | 4/2009 | Kawasaki et al. |
| 2011/0090652 A1 | 4/2011 | Wee et al. |
| 2014/0083761 A1 | 3/2014 | Wee et al. |
| 2020/0137911 A1 | 4/2020 | Kim et al. |
| 2020/0162596 A1 | 5/2020 | Kim et al. |
| 2020/0382627 A1 | 12/2020 | Park et al. |

FOREIGN PATENT DOCUMENTS

| | | |
|---|---|---|
| JP | H10-70791 A | 3/1998 |
| JP | 4560793 B2 | 10/2010 |
| JP | 2012-205254 A | 10/2012 |
| JP | 2013-140735 A | 7/2013 |
| JP | 2014-053767 A | 3/2014 |
| KR | 10-1004492 B1 | 12/2010 |
| KR | 10-1017381 B1 | 2/2011 |
| KR | 10-1018822 B1 | 3/2011 |
| KR | 10-2011-0041384 A | 4/2011 |
| KR | 10-2015-0053378 A | 5/2015 |
| KR | 10-1988965 B1 | 6/2019 |
| KR | 10-2020-0046628 A | 5/2020 |
| KR | 10-2020-0057236 A | 5/2020 |
| KR | 10-2020-0137948 A | 12/2020 |

OTHER PUBLICATIONS

European Office Action dated Feb. 5, 2025, issued in a European Patent Application No. 22 767 376.1-1218.
Korean Office Action dated Feb. 19, 2025, issued in a Korean Patent Application No. 10-2021-0031018.
Extended European Search Report dated Jun. 17, 2024, issued in European Application No. 22767376.1-1218.
Korean Decision to Grant a Patent dated Oct. 15, 2025, issued in a Korean Application No. 10-2021-0031018.

* cited by examiner (a)  (b)

ELECTRONIC DEVICE COMPRISING SEALING MEMBER

CROSS-REFERENCE TO RELATED APPLICATION(S)

This application is a continuation application, claiming priority under § 365(c), of an International application No. PCT/KR2022/002767, filed on Feb. 25, 2022, which is based on and claims the benefit of a Korean patent application number 10-2021-0031018, filed on Mar. 9, 2021, in the Korean Intellectual Property Office, the disclosure of which is incorporated by reference herein in its entirety.

BACKGROUND

1. Field

The disclosure relates to an electronic device including a plurality of sealing members.

2. Description of Related Art

The use of foldable electronic devices such as foldable phones or tablet personal computers (PCs) is increasing.

A foldable electronic device may be operated in a folded state or an unfolded state of the first housing and the second housing with respect to a hinge module.

For example, the foldable electronic device is operated in an in-folding and/or out-folding manner by rotating the first housing and the second housing using the hinge module.

The above information is presented as background information only to assist with an understanding of the disclosure. No determination has been made, and no assertion is made, as to whether any of the above might be applicable as prior art with regard to the disclosure.

SUMMARY

The foldable electronic device may include a flexible display disposed at least partially across the first housing, the hinge module, and the second housing.

In the foldable electronic device, when the first housing and the second housing are folded by using the hinge module, the flexible display may also be folded, and when the first housing and the second housing are unfolded, the flexible display may also be unfolded.

In the foldable electronic device, a first printed circuit board on which plural electronic components are mounted may be disposed in an internal space of the first housing, and a second printed circuit board on which plural electronic components are mounted may be disposed in an internal space of the second housing.

The first printed circuit board and the second printed circuit board may be electrically connected by using at least one flexible printed circuit board (FPCB).

In the foldable electronic device, if a foreign substance such as moisture flows into a through hole formed so that at least one FPCB passes through the first housing and is disposed in the second housing, electronic components mounted on the first printed circuit board and the second printed circuit board may not operate normally or may be damaged.

In the foldable electronic device, as the first housing and the second housing are operated in a folded or unfolded state with respect to the hinge module, a portion of the through hole formed adjacent to the hinge module may be vulnerable in terms of waterproofing and/or dustproofing.

Aspects of the disclosure are to address at least the above-mentioned problems and/or disadvantages and to provide at least the advantages described below. Accordingly, an aspect of the disclosure is to provide an electronic device capable of waterproofing and/or dustproofing at least one FPCB and/or through hole by using plural sealing members.

Additional aspects will be set forth in part in the description which follows and, in part, will be apparent from the description, or may be learned by practice of the presented embodiments.

In accordance with an aspect of the disclosure, an electronic device is provided. The electronic device includes a hinge module, a first housing coupled at least in part to a first side of the hinge module, the hinge module including a first substrate assembly, a second housing coupled at least in part to a second side of the hinge module, the second housing including a second substrate assembly, and formed to be folded and unfolded with respect to the first housing by using the hinge module, a flexible display supported by upper portions of the first housing and the second housing, the flexible display configured to be folded and unfolded, at least one the flexible display (FPCB) electrically connecting the first substrate assembly and the second substrate assembly, a through hole formed in the first housing to form a path through which the at least one FPCB passes, a first sealing member disposed to press a first side surface of the at least one FPCB disposed in the through hole, and a second sealing member disposed to press a second side surface of the at least one FPCB disposed in the through hole.

In accordance with another aspect of the disclosure, an electronic device is provided. The electronic device includes a hinge module, a first housing coupled at least in part to a first side of the hinge module, the first housing including a first substrate assembly, a second housing coupled at least in part to a second side of the hinge module, the second housing including a second substrate assembly, and formed to be folded and unfolded with respect to the first housing by using the hinge module, a flexible display supported by upper portions of the first housing and the second housing, the flexible display configured to be folded and unfolded, at least one the flexible display (FPCB) electrically connecting the first substrate assembly and the second substrate assembly, a through hole formed in the first housing to form a path through which the at least one FPCB passes, a first sealing member disposed to press a first side surface of the at least one FPCB disposed in the through hole, and a second sealing member disposed to press a second side surface of the at least one FPCB disposed in the through hole, wherein the first sealing member may include a first packing portion formed to protrude from one side surface, the second sealing member may include a second packing portion formed to protrude from a specified position at a preset interval, and some of the first packing portion and some of the second packing portion may be coupled to overlap each other inside the through hole.

Various embodiments of the disclosure may utilize a plurality of sealing members to increase waterproofing and/or dustproofing efficiency against moisture and/or foreign substances introduced into the housing through a through hole and/or at least one FPCB.

Various embodiments of the disclosure may provide an electronic device capable of waterproofing and/or dustproofing against moisture and/or foreign substance introduced from the outside by using a first sealing member and a second sealing member to press both side surfaces of the first FPCB and/or the second FPCB disposed in the through hole formed adjacent to the folding region (e.g., folding axis) of the first housing and/or the second housing.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Various embodiments of this document and terms used therein are not intended to limit the technical features described in this document to specific embodiments, and should be understood as including various modifications, equivalents, or substitutes of a corresponding embodiment. With regard to the description of the drawings, similar reference symbols may be used to refer to similar or related elements. In this document, each of phrases such as "A or B", "at least one of A and B", "at least one of A or B", "A, B or C", "at least one of A, B and C", and "at least one of A, B or C" may include any one of or all possible combinations of the items enumerated together in the corresponding one of the phrases. Terms such as "1st" and "2nd", or "first" and "second" may be used to simply distinguish a corresponding component from another, and does not limit the components in other aspect (e.g., importance or order).

The term "module" used in this document may be a single integral component, or a minimum unit or part thereof performing one or more functions.

Figure 1A:
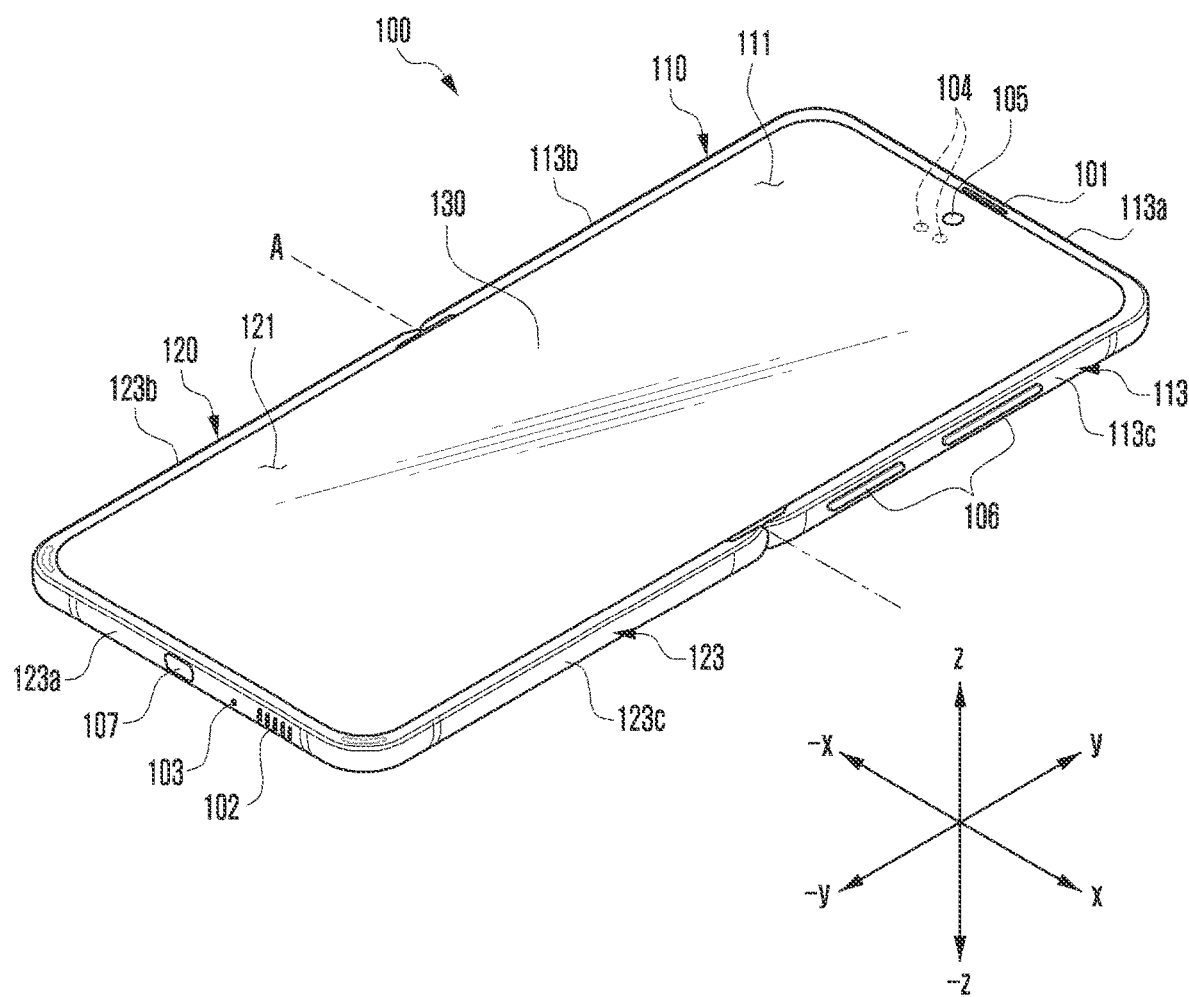
FIG. 1A is a front perspective view of an electronic device in unfolded state according to an embodiment of the disclosure.

FIG. 1A is a front perspective view of an electronic device in unfolded state according to an embodiment of the disclosure.

Figure 1B:
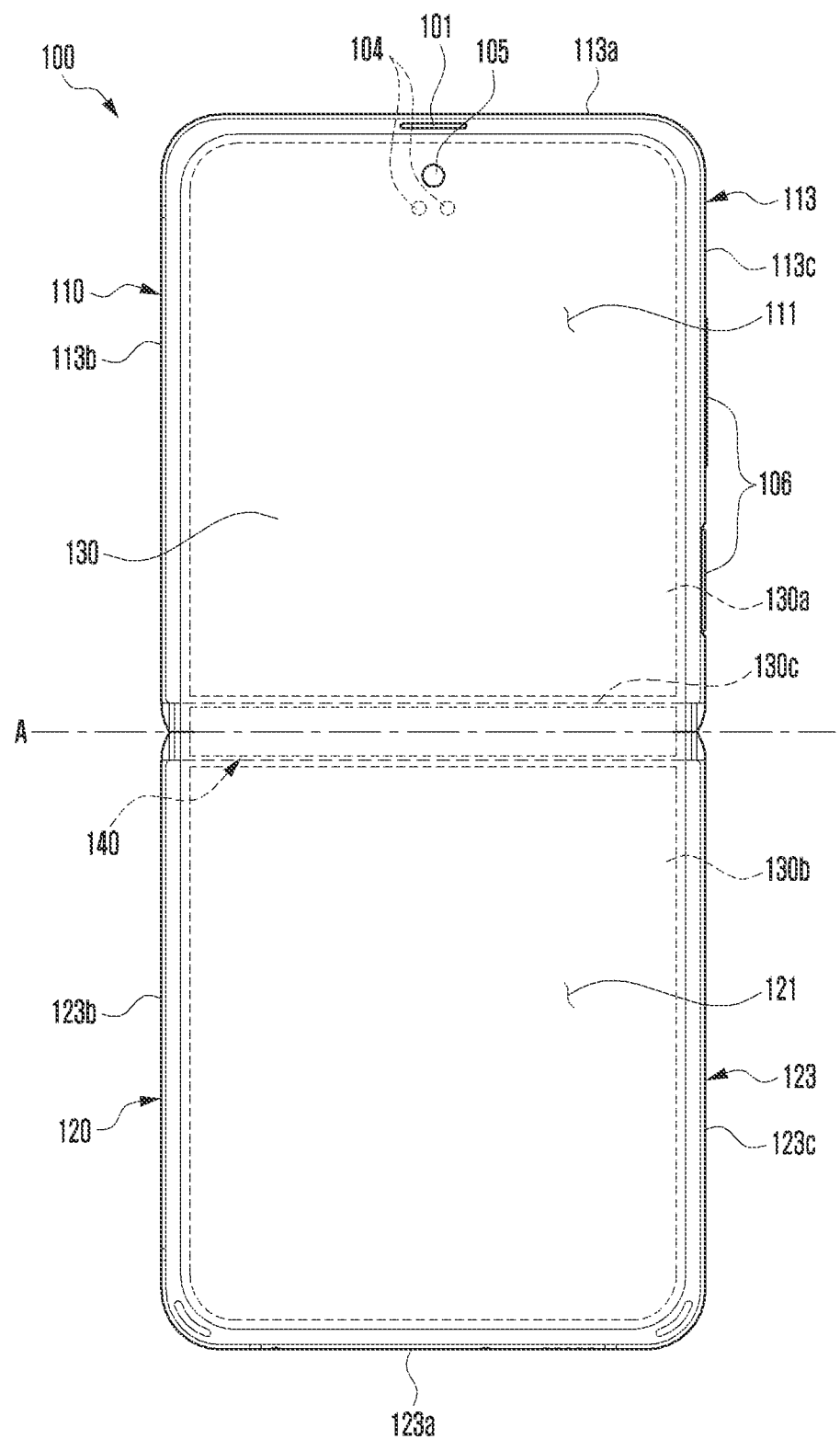
FIG. 1B is a plan view illustrating a front surface of an electronic device in unfolded state according to an embodiment of the disclosure.

FIG. 1B is a plan view illustrating a front surface of an electronic device in unfolded state according to an embodiment of the disclosure.

Figure 1C:
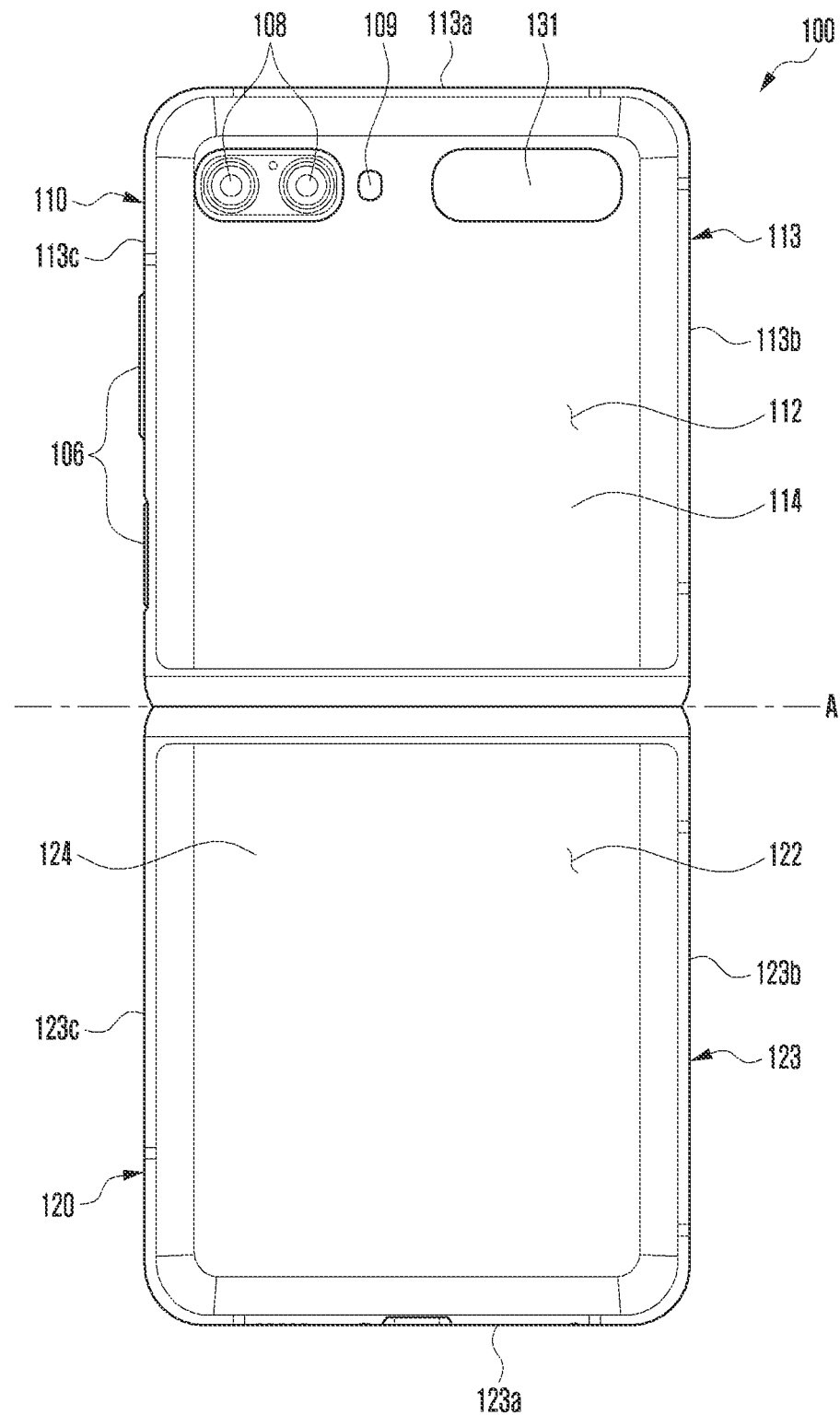
FIG. 1C is a plan view illustrating a rear surface of an electronic device in unfolded state according to an embodiment of the disclosure.

FIG. 1C is a plan view illustrating a rear surface of an electronic device in unfolded state according to an embodiment of the disclosure.

Figure 2A:
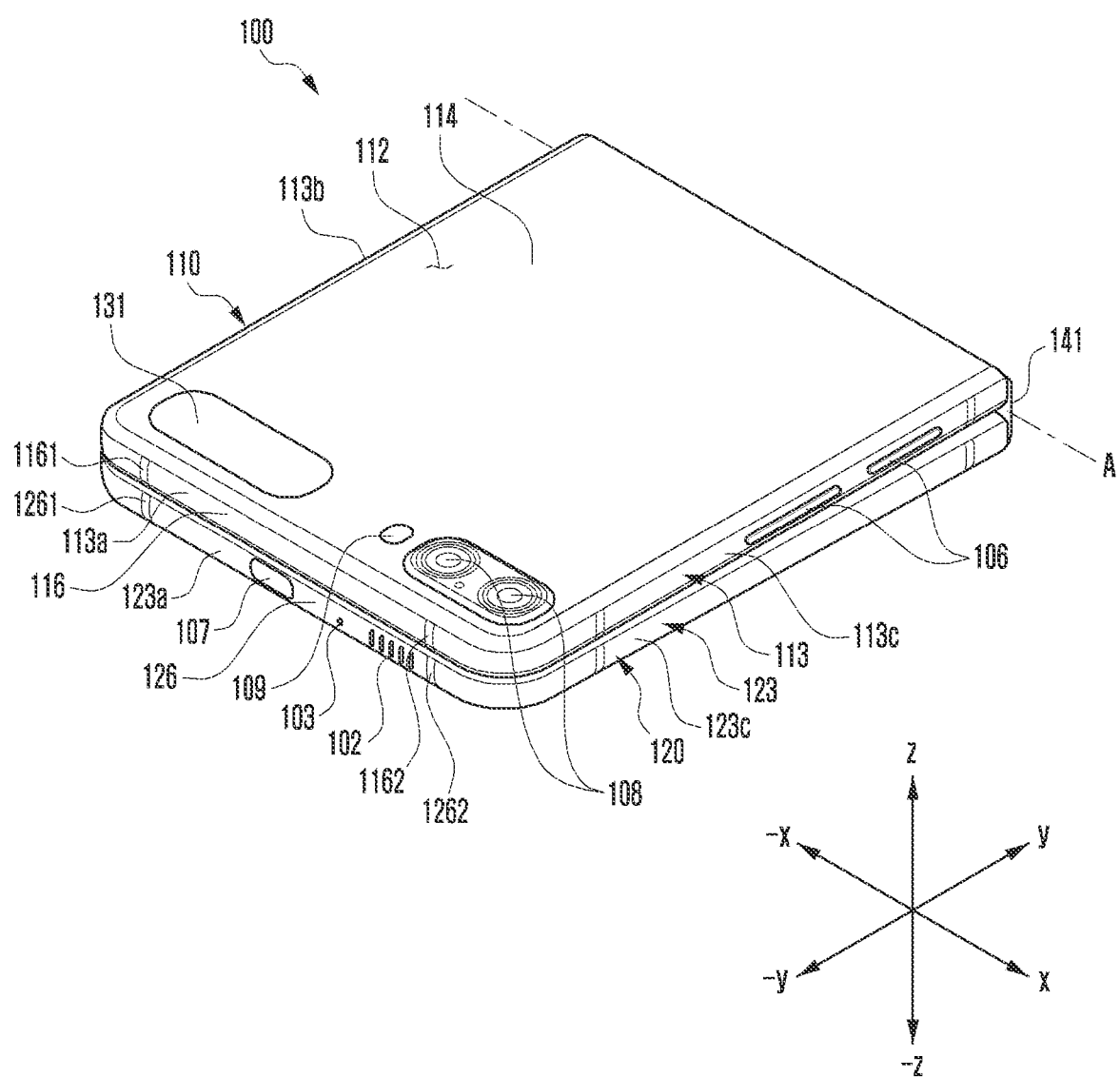
FIG. 2A is a perspective view of an electronic device in folded state according to an embodiment of the disclosure.

FIG. 2A is a perspective view of an electronic device in folded state according to an embodiment of the disclosure.

Figure 2B:
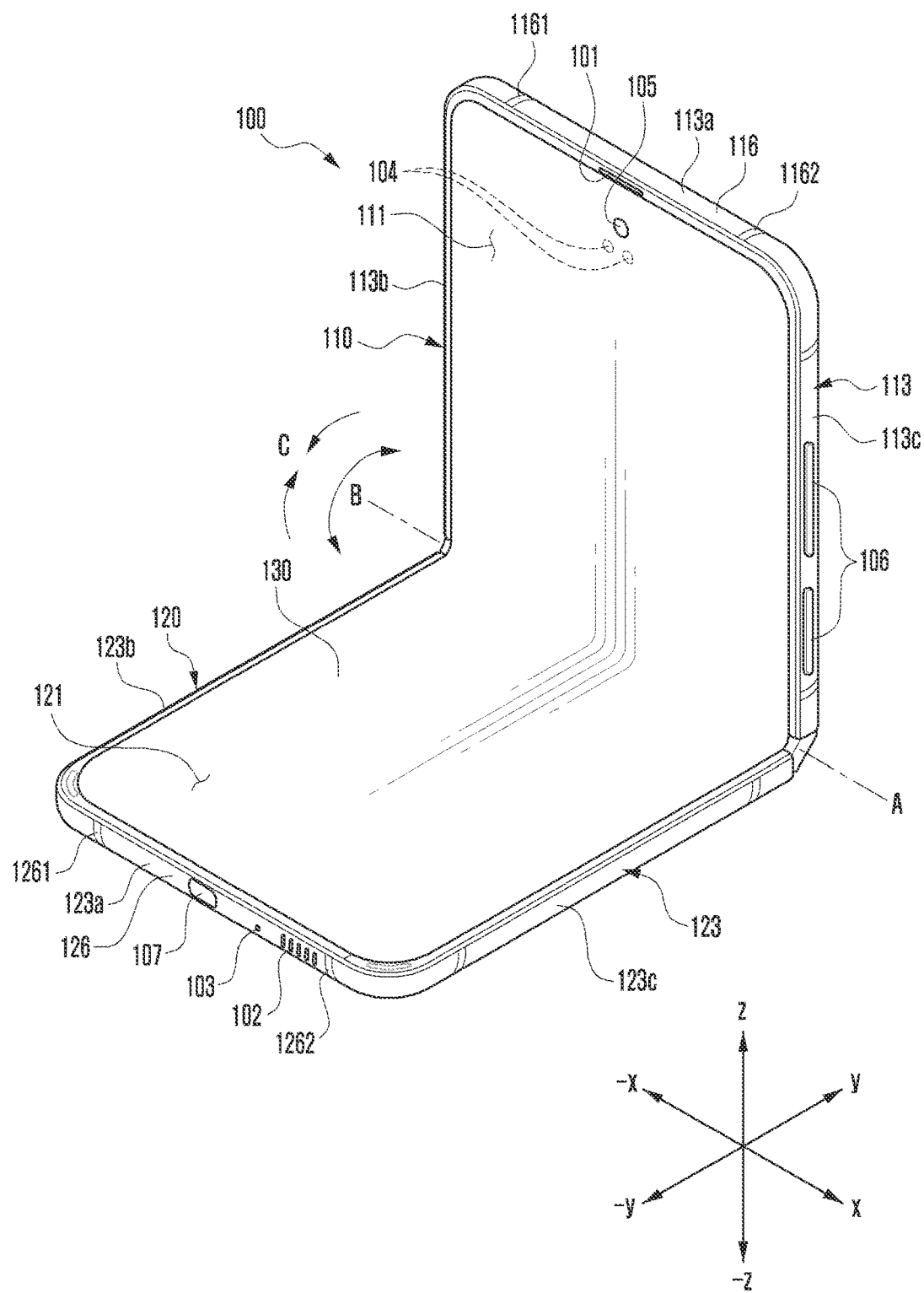
FIG. 2B is a perspective view illustrating a front surface of an electronic device in intermediate state according to an embodiment of the disclosure.

FIG. 2B is a perspective view illustrating a front surface of an electronic device in intermediate state according to an embodiment of the disclosure.

The electronic device 100 disclosed in FIGS. 1A to 1C, 2A, and 2B may include, for example, a foldable electronic device that is folded or unfolded in a vertical direction. Although various embodiments of the disclosure describe a foldable electronic device that is folded or unfolded in a vertical direction, the same may be applied to a foldable electronic device that is folded or unfolded in a horizontal direction.

Figure 3:
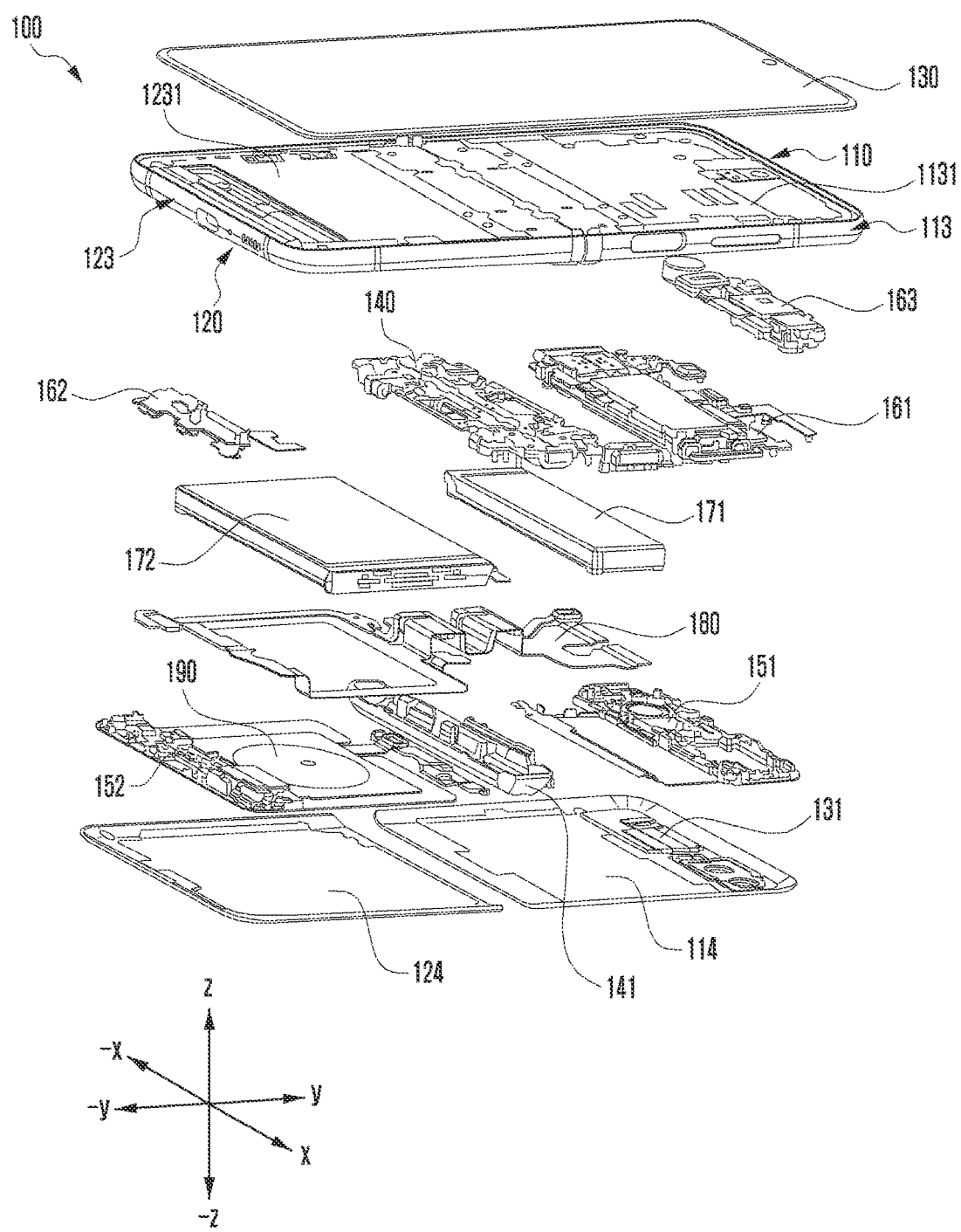
FIG. 3 is an exploded perspective view of an electronic device according to an embodiment of the disclosure.

Referring to FIGS. 1A to 1C, 2A, and 2B, the electronic device 100 according to various embodiments of the disclosure may include a pair of housings (e.g., first housing 110, second housing 120) (e.g., foldable housing) folded to face each other with respect to a hinge module 140 (e.g., hinge module 140 in FIG. 1B or 3). In a certain embodiment, the hinge module 140 (e.g., hinge module 140 in FIG. 1B or 3) may be disposed in an x-axis direction (e.g., horizontal direction) or in a y-axis direction (e.g., vertical direction). In a certain embodiment, two or more hinge modules 140 may be arranged to be folded in the same direction or in different directions.

According to various embodiments, the electronic device 100 may include a flexible display 130 (e.g., foldable display) disposed in an area formed by the pair of housings 110 and 120. The first housing 110 and the second housing 120 may be disposed on both sides about the folding axis (axis A), and may have a substantially symmetrical shape with respect to the folding axis (axis A). The angle or distance between the first housing 110 and the second housing 120 may vary depending on whether the state of the electronic device 100 is a flat or unfolded state, a folded state, or an intermediate state.

According to various embodiments, the pair of housings 110 and 120 may include a first housing 110 (e.g., first housing structure) coupled to a first side of the hinge module 140 (e.g., hinge module 140 in FIG. 1B or 3), and a second housing 120 (e.g., second housing structure) coupled to a second side of the hinge module 140. In the unfolded state, the first housing 110 may include a first surface 111 facing in a first direction (e.g., front (z-axis) direction), and a second surface 112 facing in a second direction (e.g., rear (negative z-axis) direction) opposite to the first direction. In the unfolded state, the second housing 120 may include a third surface 121 facing in the first direction (e.g., front (z-axis) direction), and a fourth surface 122 facing in the second direction (e.g., rear (negative z-axis) direction).

According to an embodiment, the electronic device 100 may be operated in a manner that the first surface 111 of the first housing 110 and the third surface 121 of the second housing 120 face substantially in the same first direction (e.g., z-axis direction) in the unfolded state, and the first surface 111 and the third surface 121 face each other in the folded state. The electronic device 100 may be operated in a manner that the second surface 112 of the first housing 110 and the fourth surface 122 of the second housing 120 face substantially in the same second direction (e.g., negative z-axis direction) in the unfolded state, and the second surface 112 and the fourth surface 122 face each other in opposite directions in the folded state. For example, when the first housing 110 and the second housing 120 are in the folded state, the second surface 112 faces in the first direction (e.g., z-axis direction), and the fourth surface 122 may face in the second direction (e.g., negative z-axis direction).

According to various embodiments, the first housing 110 may include a first side frame 113 that at least partially constitutes the external appearance of the electronic device 100, and a first rear cover 114 coupled to the first side frame 113 and constituting at least a portion of the second surface 112 of the electronic device 100. The first side frame 113 may include a first side surface 113a, a second side surface 113b extending from one end of the first side surface 113a, and a third side surface 113c extending from the other end of the first side surface 113a. The first side frame 113 may be formed in a rectangular shape (e.g., square or rectangle) through the first side surface 113a, second side surface 113b, and third side surface 113c.

According to various embodiments, the second housing 120 may include a second side frame 123 that at least partially constitutes the external appearance of the electronic device 100, and a second rear cover 124 coupled to the second side frame 123 and constituting at least a portion of the fourth surface 122 of the electronic device 100. The second side frame 123 may include a fourth side surface 123a, a fifth side surface 123b extending from one end of the fourth side surface 123a, and a sixth side surface 123c extending from the other end of the fourth side surface 123a. The second side frame 123 may be formed in a rectangular shape (e.g., square or rectangle) through the fourth side surface 123a, fifth side surface 123b, and sixth side surface 123c.

According to various embodiments, the pair of housings 110 and 120 are not limited to the illustrated shape and combination, and may be implemented with a combination of other shapes or parts. For example, the first lateral frame (i.e., first side frame 113) is integrally formed with the first rear cover 114, and the second lateral frame 123 may be integrally formed with the second rear cover 124.

According to various embodiments, in the unfolded state of the electronic device 100, the second side surface 113b of the first lateral frame (i.e., first side frame 113) and the fifth side surface 123b of the second lateral frame 123 may be connected without a gap. In the unfolded state of the electronic device 100, the third side surface 113c of the first lateral frame (i.e., first side frame 113) and the sixth side surface 123c of the second side frame 123 may be connected without a gap. In the unfolded state, the electronic device 100 may be configured such that the combined length of the second side surface 113b and the fifth side surface 123b is longer than the length of the first side surface 113a and/or the fourth side surface 123a. The electronic device 100 may be configured such that the combined length of the third side surface 113c and the sixth side surface 123c is longer than the length of the first side surface 113a and/or the fourth side surface 123a.

According to various embodiments, the first lateral frame (i.e., first side frame 113) and/or the second lateral frame 123 may be made of a metal or may further include a polymer injected into a metal. The first lateral frame (i.e., first side frame 113) and/or the second lateral frame 123 may include at least one conductive part 116 and/or 126 electrically segmented through one or more cut-off portion 1161 and 1162 and/or 1261 and 1262 made of a polymer. In this case, the at least one conductive part 116 and/or 126 may be electrically connected to a wireless communication circuit disposed on a printed circuit board (e.g., first substrate assembly 161 in FIG. 3) included in the electronic device 100 and may be used as an antenna operating in at least one designated band (e.g., legacy band).

According to various embodiments, the first rear cover 114 and/or the second rear cover 124 may be made of, for example, coated or tinted glass, ceramic, polymer, metal (e.g., aluminum, stainless steel (STS), or magnesium), or a combination thereof.

According to various embodiments, the flexible display 130 may be disposed to extend from the first surface 111 of the first housing 110 across the hinge module 140 (e.g., hinge module 140 in FIG. 1B) to at least a portion of the third surface 121 of the second housing 120. For example, the flexible display 130 includes a first flat region 130a substantially corresponding to the first surface 111, a second flat region 130b corresponding to the second surface 121, and a folding region 130c (e.g., bending region) connecting the first flat region 130a and the second flat region 130b and corresponding to the hinge module 140 (e.g., hinge module 140 in FIG. 1B or 3).

According to another embodiment, the flexible display 130 may include an unbreakable (UB) type organic light-emitting diode (OLED) display (e.g., curved display). However, without being limited thereto, the flexible display 130 may include a flat type display based on optical coherence tomography angiography (OCTA) (on-cell touch active matrix organic light-emitting diode (AMOLED)).

According to various embodiments, for the flexible display 130, the periphery (e.g., outer surface) of the first flat region 130a may be disposed on the inner surface of the first housing 110. For the flexible display 130, the periphery (e.g., outer surface) of the second flat region 130b may be disposed on the inner surface of the second housing 120. The periphery of the flexible display 130 may be protected by a protective cap (not shown) disposed in a region corresponding to the hinge module 140 (e.g., hinge module 140 in FIG. 1B or 3). The protective cap (not shown) may be selectively used or omitted according to the specification of the electronic device 100.

According to various embodiments, the electronic device 100 may include a hinge housing 141 (e.g., hinge cover). The hinge housing 141 may be disposed so as to support the hinge module 140 (e.g., hinge module 140 in FIG. 1B or 3), be exposed to the outside when the electronic device 100 is in the folded state, and be invisible from the outside by being pulled into a first space (e.g., internal space of the first housing 110) and a second space (e.g., internal space of the second housing 120) when the electronic device 100 is in the unfolded state. In a certain embodiment, the flexible display 130 may be disposed to extend from at least a portion of the second surface 112 to at least a portion of the fourth surface 122.

According to various embodiments, the electronic device 100 may include a sub-display 131 disposed separately from the flexible display 130. The sub-display 131 may be disposed to be at least partially exposed on the second surface 112 of the first housing 110, and may display status information of the flexible display 130 when the electronic device 100 is in the folded state. The sub-display 131 may be disposed to be visible from the outside through at least some region of the first rear cover 114. In a certain embodiment, the sub-display 131 may be disposed on the fourth surface 122 of the second housing 120. In this case, the sub-display 131 may be disposed to be visible from the outside through at least some region of the second rear cover 124.

According to various embodiments, the electronic device 100 may include at least one of an input device 103 (e.g., microphone), sound output devices 101 and 102, a sensor module 104, camera devices 105 and 108, a key input device 106, or a connector port 107. In the illustrated embodiment, the input device 103 (e.g., microphone), sound output devices 101 and 102, sensor module 104, camera devices 105 and 108, key input device 106, and connector port 107 indicate a hole or shape formed in the first housing 110 or the second housing 120, but may be defined to include a substantial electronic component (e.g., input device, sound output device, sensor module, or camera device) that is disposed inside the electronic device 100 and operated through a hole or a shape.

According to various embodiments, the input device 103 may include at least one microphone 103 disposed on the second housing 120. In a certain embodiment, the input device 103 may include a plurality of microphones 103 disposed to detect the direction of a sound. In a certain embodiment, a plurality of microphones 103 may be disposed at appropriate positions in the first housing 110 and/or the second housing 120. The sound output devices 101 and 102 may include speakers 101 and 102. The speakers 101 and 102 may include a speaker 101 for calls disposed in the first housing 110, and a speaker 102 disposed in the second housing 120. In a certain embodiment, the input device 103, the sound output devices 101 and 102, and the connector port 107 may be disposed in a space arranged in the first housing 110 and/or the second housing 120 of the electronic device 100, and may be exposed to the outside through at least one hole formed in the first housing 110 and/or the second housing 120. At least one connector port 107 may be used to transmit and receive power and/or data to and from an external electronic device. In a certain embodiment, at least one connector port (e.g., ear jack hole) may accommodate a connector (e.g., ear jack) for transmitting and receiving an audio signal to and from an external electronic device. In a certain embodiment, the hole formed in the first housing 110 and/or the second housing 120 may be commonly used for the input device 103 and the sound output devices 101 and 102. In a certain embodiment, the sound output devices 101 and 102 may include a speaker (e.g., piezo speaker) that operates without using a hole formed in the first housing 110 and/or the second housing 120.

According to various embodiments, the sensor module 104 may generate an electrical signal or data value corresponding to an internal operating state of the electronic device 100 or an external environmental state. The sensor module 104 may detect an external environment, for example, through the first surface 111 of the first housing 110. In a certain embodiment, the electronic device 100 may further include at least one sensor module disposed to detect an external environment through the second surface 112 of the first housing 110. The sensor module 104 (e.g., illuminance sensor) may be disposed under the flexible display 130 to detect an external environment through the flexible display 130. The sensor module 104 may include at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, a proximity sensor, a biometric sensor, an ultrasonic sensor, or an illuminance sensor 104.

According to various embodiments, the camera devices 105 and 108 may include a first camera device 105 (e.g., front camera device) disposed on the first surface 111 of the first housing 110, and a second camera device 108 disposed on the second surface 112 of the first housing 110. The electronic device 100 may further include a flash 109 disposed close to the second camera device 108. The camera device 105 or 108 may include one or more lenses, an image sensor, and/or an image signal processor. The flash 109 may include, for example, a light emitting diode or a xenon lamp. The camera devices 105 and 108 may be arranged so that two or more lenses (e.g., wide-angle lens, super-wide-angle lens, or telephoto lens) and image sensors are positioned on one surface (e.g., first surface 111, second surface 112, third surface 121, or fourth surface 122) of the electronic device 100. In a certain embodiment, the camera devices 105 and 108 may include time-of-flight (TOF) lenses and/or an image sensor.

According to various embodiments, the key input device 106 (e.g., key button) may be disposed on the third side surface 113c of the first side frame 113 of the first housing 110. In a certain embodiment, the key input device 106 may be disposed on at least one side surface among the other side surfaces 113a and 113b of the first housing 110 and/or the side surfaces 123a, 123b and 123c of the second housing 120. In a certain embodiment, the electronic device 100 may not include some or all of the key input devices 106, and those not included key input devices 106 may be implemented in other forms, such as soft keys, on the flexible display 130. In a certain embodiment, the key input device 106 may be implemented by using a pressure sensor included in the flexible display 130.

According to various embodiments, some of the camera devices 105 and 108 (e.g., first camera device 105) or the sensor module 104 may be disposed to be exposed through the flexible display 130. For example, the first camera device 105 or the sensor module 104 arranges in the internal space of the electronic device 100 so as to be in contact with the external environment through an opening (e.g., through hole) formed at least partially in the flexible display 130. Some sensor modules 104 may be arranged in the internal space of the electronic device 100 so as to perform their functions without being visually exposed through the flexible display 130. In this case, the opening of a region of the flexible display 130 facing the sensor module may be not needed.

Referring to FIG. 2B, the electronic device 100 may be operated to remain in an intermediate state through the hinge module 140 (e.g., hinge module 140 in FIG. 1B or 3). In this case, the electronic device 100 may control the flexible display 130 to display different pieces of content on the display area (e.g., first flat region 130a) corresponding to the first surface 111 and the display area (e.g., second flat region 130a) corresponding to the third surface 121. The electronic device 100 may be operated substantially in an unfolded state (e.g., unfolded state of FIG. 1A) and/or substantially in a folded state (e.g., folded state of FIG. 2A) with respect to a specific inflection angle (e.g., angle between the first housing 110 and the second housing 120 in the intermediate state) through the hinge module 140. For example, when a pressing force is applied in the unfolding direction (B direction) in a state where the electronic device 100 is unfolded at a specific inflection angle, through the hinge module 140, the electronic device 100 is transitioned to an unfolded state (e.g., unfolded state of FIG. 1A). For example, when a pressing force is applied in the folding direction (C direction) in a state where the electronic device 100 is unfolded at a specific inflection angle, through the hinge module 140, the electronic device 100 is transitioned to a closed state (e.g., folded state of FIG. 2A). The electronic device 100 may be operated to remain in a folded or unfolded state at various angles through the hinge module 140.

FIG. 3 is an exploded perspective view of an electronic device (e.g., foldable electronic device) according to an embodiment of the disclosure.

Referring to FIG. 3, the electronic device 100 may include a first lateral frame (i.e., first side frame 113) of the first housing 110, a second lateral frame 123 of the second housing 120, and a hinge module 140 (e.g., hinge module 140 in FIG. 1B) rotatably connecting the first lateral frame (i.e., first side frame 113) and the second lateral frame 123.

According to an embodiment, the electronic device 100 may include a first support plate 1131 at least partially extended from the first side frame 113 of the first housing 110, and a second support plate 1231 at least partially extended from the second side frame 123 of the second housing 120. The first support plate 1131 may be integrally formed with the first lateral frame (i.e., first side frame 113) or may be structurally coupled to the first lateral frame (i.e., first side frame 113). The second support plate 1231 may be integrally formed with the second lateral frame 123 or may be structurally coupled to the second lateral frame 123. The electronic device 100 may include a flexible display 130 disposed to be supported by the first support plate 1131 and the second support plate 1231.

According to an embodiment, the electronic device 100 may include a first rear cover 114 that is coupled to the first side frame 113 of the first housing 110 and provides a first space between itself and the first support plate 1131, and a second rear cover 124 that is coupled to the second lateral frame 123 of the second housing 120 and provides a second space between itself and the second support plate 1231. In a certain embodiment, the first lateral frame (i.e., first side frame 113) and the first rear cover 114 may be integrally formed. In a certain embodiment, the second side frame 123 and the second rear cover 124 may be integrally formed.

According to an embodiment, the electronic device 100 may include a first housing 110 (e.g., first housing 110 in FIG. 1A) provided through the first lateral frame (i.e., first side frame 113), the first support plate 1131, and the first rear cover 114. The electronic device 100 may include a second housing 120 (e.g., second housing 120 in FIG. 1A) provided through the second side frame 123, the second support plate 1231, and the second rear cover 124. The electronic device 100 may include a sub-display 131 that is disposed to be visible from the outside through at least some region of the first rear cover 114.

According to various embodiments, the electronic device 100 may include a first substrate assembly 161 (e.g., main printed circuit board), a camera assembly 163, a first battery 171, or a first bracket 151, arranged in the first space between the first lateral frame (i.e., first side frame 113) and the first rear cover 114.

According to an embodiment, the camera assembly 163 may include a plurality of camera devices (e.g., camera devices 105 and 108 in FIGS. 1A and 2A), and may be electrically connected to the first substrate assembly 161. The first bracket 151 may provide a support structure for supporting the first substrate assembly 161 and/or the camera assembly 163.

According to an embodiment, the electronic device 100 may include a second substrate assembly 162 (e.g., sub printed circuit board), an antenna 190 (e.g., coil member), a second battery 172, or a second bracket 152, arranged in the second space between the second lateral frame 123 and the second rear cover 124.

According to an embodiment, the electronic device 100 may include a wiring member 180 (e.g., flexible printed circuit board (FPCB)) that is disposed to extend from the first substrate assembly 161 across the hinge module 140 to a plurality of electronic components (e.g., second substrate assembly 162, second battery 172, antenna 190) arranged between the second lateral frame 123 and the second rear cover 124 to provide electrical connections. The antenna 190 may include a near field communication (NFC) antenna, a wireless charging antenna, and/or a magnetic secure transmission (MST) antenna. The antenna 190 may, for example, perform short-range communication with an external device or wirelessly transmit and receive power required for charging.

According to various embodiments, the electronic device 100 may include a hinge housing 141 (e.g., hinge cover) that supports or covers the hinge module 140 and is disposed so as to be exposed to the outside when the electronic device 100 is in the folded state (e.g., folded state of FIG. 2A) and be invisible from the outside by being pulled into the first space and/or the second space when the electronic device 100 is in the unfolded state (e.g., unfolded state of FIG. 1A).

Figure 4A:
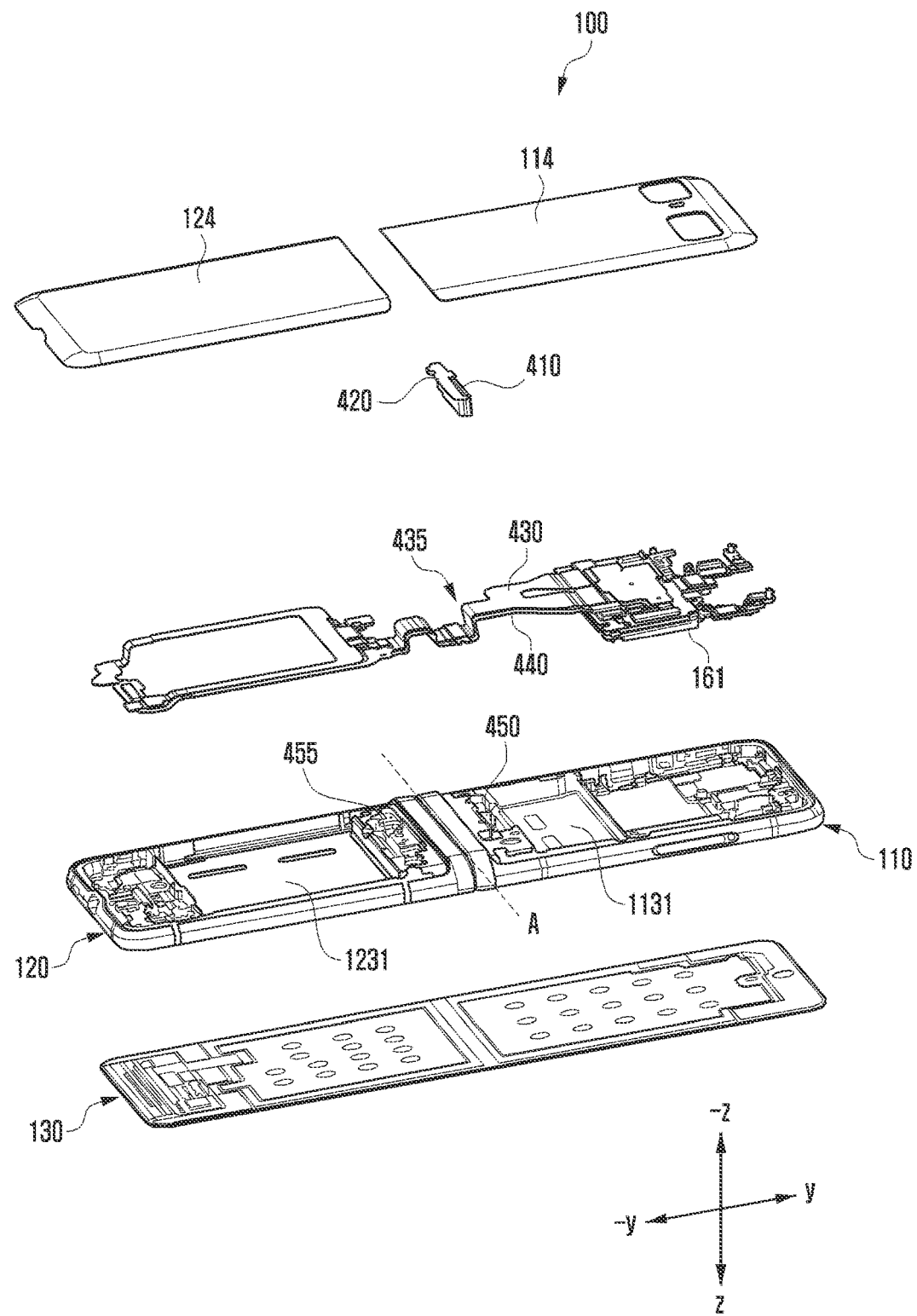
FIG. 4A is a schematic exploded perspective view of a part of an electronic device according to an embodiment of the disclosure.

FIG. 4A is a schematic exploded perspective view of a part of an electronic device according to an embodiment of the disclosure.

Figure 4B:
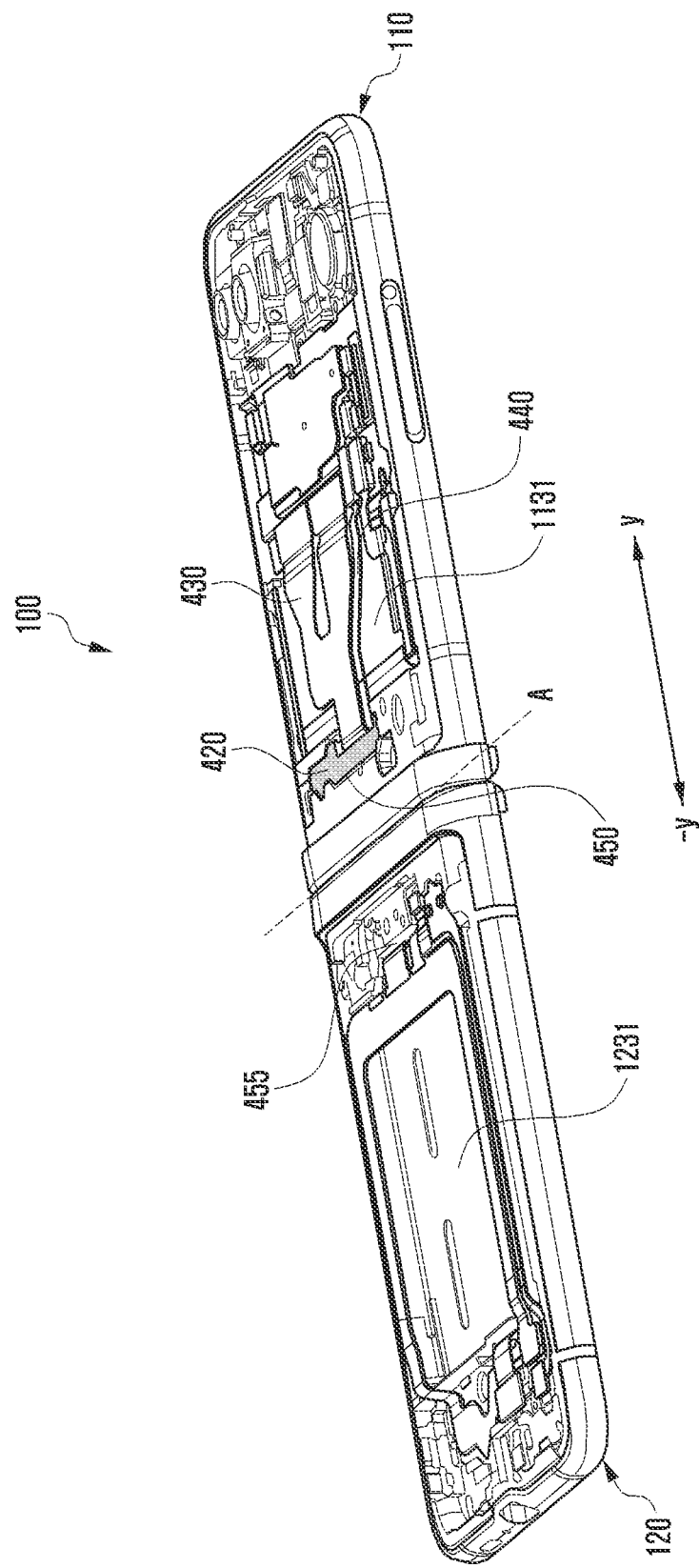
FIG. 4B is a schematic view illustrating a state in which parts of an electronic device are coupled according to an embodiment of the disclosure.

FIG. 4B is a schematic view illustrating a state in which parts of an electronic device are coupled according to an embodiment of the disclosure.

According to various embodiments, embodiments of the electronic device 100 disclosed below may include the embodiments disclosed in FIGS. 1A to 1C, 2A, 2B, and 3. In the description of various embodiments disclosed below, the same reference symbols are assigned to the same components as those of the embodiments disclosed in FIGS. 1A to 1C, 2A, 2B, and 3 described above, and a repeated description for the functions may be omitted.

Referring to FIGS. 4A and 4B, the electronic device 100 according to various embodiments of the disclosure may include a first housing 110, a second housing 120, a flexible display 130, a first sealing member 410, a second sealing member 420, a first FPCB 430, a second FPCB 440, a first rear cover 114 and/or a second rear cover 124.

According to various embodiments, the first housing 110 may be disposed on a first side (e.g., in y-axis direction) with respect to the folding axis (A-axis). The second housing 120 may be disposed on a second side (e.g., in negative y-axis direction) with respect to the folding axis (A-axis). The first housing 110 and the second housing 120 may have substantially symmetrical shapes with respect to the folding axis (A-axis). The first housing 110 and the second housing 120 may be configured to be folded and unfolded with respect to the folding axis (A-axis) of a hinge module (e.g., hinge module 140 in FIG. 1B or 3).

According to an embodiment, the first housing 110 may be coupled at least in part to a first side of the hinge module 140. For example, the first housing 110 may be at least in part coupled to the first side of the hinge module 140 by using the first support plate 1131.

According to an embodiment, the first housing 110 may include a through hole 450 (e.g., first through hole) formed at a portion adjacent to the folding axis (A-axis). The through hole 450 may form a passage through which the first FPCB 430 and/or the second FPCB 440 pass from the first housing 110 to the second housing 120. The first sealing member 410 and the second sealing member 420 coupled to press both sides of a portion of the first FPCB 430 and/or a portion of the second FPCB 440 may be disposed in the through hole 450.

According to an embodiment, the second housing 120 may be coupled at least in part to a second side of the hinge module 140. For example, the second housing 120 is coupled at least in part to the second side of the hinge module 140 by using the second support plate 1231.

According to an embodiment, the second housing 120 may include a through hole 455 (e.g., second through hole) formed at a portion adjacent to the folding axis (A-axis). The through hole 455 may form a passage through which the first FPCB 430 and/or the second FPCB 440 pass. According to various embodiments, the first sealing member 410 and the second sealing member 420 disposed in the through hole 450 (e.g., first through hole) of the first housing 110 may also be applied to the through hole 455 (e.g., second through hole) formed in the second housing 120.

According to an embodiment, the flexible display 130 may be disposed across the first housing 110 and the second housing 120. The flexible display 130 may be disposed on a first surface (e.g., z-axis direction) of the first housing 110 and a first surface (e.g., z-axis direction) of the second housing 120 so as to be foldable and/or unfoldable.

According to various embodiments, the first sealing member 410 and the second sealing member 420 may press both side surfaces of a substantially vertical portion 435 of the first FPCB 430 and/or the second FPCB 440 inserted into the through hole 450 (e.g., first through hole) of the first housing 110. The first sealing member 410 and the second sealing member 420 may be disposed to face each other and be coupled to each other so as to press both side surfaces of the first FPCB 430 and/or the second FPCB 440 disposed between the first sealing member 410 and the second sealing member 420. The first sealing member 410 and the second sealing member 420 may be inserted into the through hole 450 (e.g., first through hole) to perform waterproofing and/or dustproofing against moisture and/or foreign matter introduced from the outside through the through hole 450. The first sealing member 410 and the second sealing member 420 may be inserted into the through hole 450 (e.g., first through hole) via interference fitting.

According to an embodiment, the first sealing member 410 may be disposed on a first side surface (e.g., in y-axis direction) of the first FPCB 430 and/or the second FPCB 440. The first sealing member 410 may press the first side surface of the vertical portion 435 in which a portion of the first FPCB 430 and/or the second FPCB 440 is bent in one direction (e.g., z-axis direction).

According to an embodiment, the second sealing member 420 may be disposed on a second side surface (e.g., in negative y-axis direction) of the first FPCB 430 and/or the second FPCB 440. The second sealing member 420 may press the second side surface of the vertical portion 435 in which a portion of the first FPCB 430 and/or the second FPCB 440 is bent in one direction (e.g., z-axis direction).

According to various embodiments, the first FPCB 430 and/or the second FPCB 440 may be at least partially disposed in the first housing 110 and the second housing 120. The first FPCB 430 and/or the second FPCB 440 may be extended through the through hole 450 (e.g., first through hole) formed in the first housing 110 and the through hole 445 (e.g., second through hole) formed in the second housing 120, and may be disposed at least partially in the first housing 110 and the second housing 120. One end of the first FPCB 430 and one end of the second FPCB 440 may be electrically connected to the first substrate assembly 161 disposed in the first housing 110, and the other end of the first FPCB 430 and the other end of the second FPCB 440 may be electrically connected to a plurality of electronic components (e.g., second substrate assembly 162, second battery 172, and/or antenna 190 in FIG. 3) disposed in the second housing 120.

According to an embodiment, the first FPCB 430 and/or the second FPCB 440 may include a vertical portion 435 in which a portion inserted into the through hole 450 (e.g., first through hole) of the first housing 110 is bent in one direction (e.g., z-axis direction). The first FPCB 430 and the second FPCB 440 may be different types of signal connection members. The first FPCB 430 and the second FPCB 440 may be configured to have different thicknesses or widths. The first FPCB 430 may include the wiring member 180 shown in FIG. 3. The second FPCB 440 may include a FPCB type radio frequency (RF) cable (e.g., FRC).

According to various embodiments, the first rear cover 114 may be coupled to the first lateral frame 113 (i.e., first side frame 113 in FIG. 3) of the first housing 110, and may cover the rear surface (e.g., negative z-axis direction) of the first housing 110. The second rear cover 124 may be coupled to the second lateral frame 123 (e.g., second lateral frame 123 in FIG. 3) of the second housing 120, and may cover the rear surface (e.g., negative z-axis direction) of the second housing 120.

Figure 5:
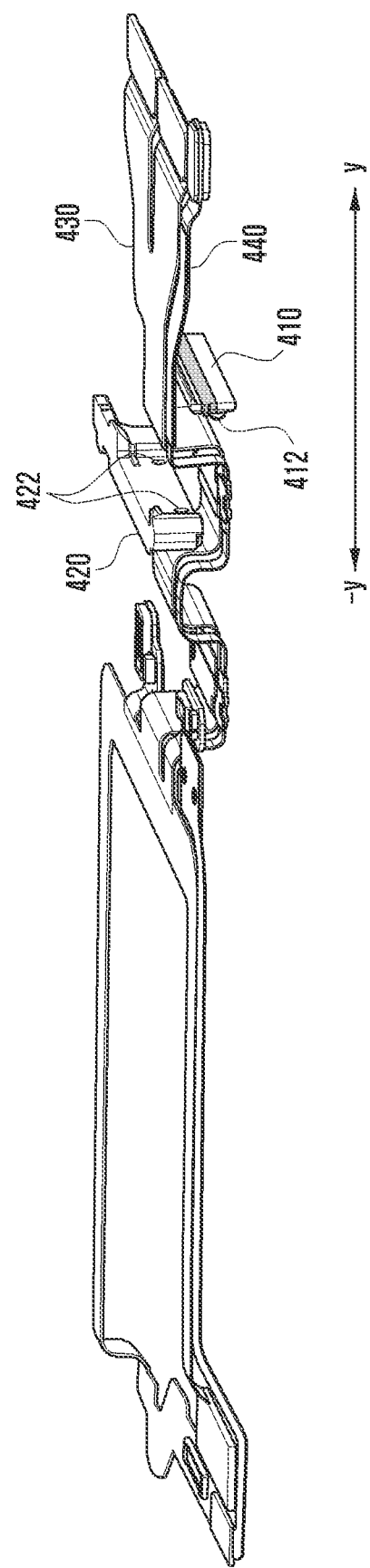
FIG. 5 is a schematic exploded perspective view illustrating a first FPCB, a second FPCB, a first sealing member, and a second sealing member of an electronic device according to an embodiment of the disclosure.

FIG. 5 is a schematic exploded perspective view illustrating a first FPCB, a second FPCB, a first sealing member, and a second sealing member of the electronic device according to an embodiment of the disclosure.

Referring to FIG. 5, the first sealing member 410 may be disposed on a first side surface (e.g., y-axis direction) of the vertical portion (e.g., vertical portion 435 in FIG. 4A) in which at least a portion of the first FPCB 430 and the second FPCB 440 is bent in one direction. The second sealing member 420 may be disposed on a second side surface (e.g., negative y-axis direction) of the vertical portion in which at least a portion of the first FPCB 430 and the second FPCB 440 is bent in one direction.

According to various embodiments, the first sealing member 410 may include at least one first coupling portion 412. The second sealing member 420 may include at least one second coupling portion 422 formed at a position corresponding to the at least one first coupling portion 412. The first coupling portion 412 may include a coupling protrusion protruding in one direction (e.g., negative y-axis direction) from one side surface of the first sealing member 410. The second coupling portion 422 may include a coupling groove that is coupled to the first coupling portion 412 (e.g., coupling protrusion) in a fitting manner. In various embodiments, since the first sealing member 410 and the second sealing member 420 are inserted and compressed into the through hole 450 (e.g., first through hole) and/or the through hole 455 (e.g., second through hole), the at least one first coupling portion 412 of the first sealing member 410 and the at least one second coupling portion 422 of the second sealing member 420 may be omitted.

According to various embodiments, when the first sealing member 410 has two first coupling portions 412 (e.g., coupling protrusion), the two first coupling portions 412 may be disposed to be spaced apart from each other. When the second sealing member 420 has two second coupling portions 422 (e.g., coupling groove), the two second coupling portions 422 may be disposed to be spaced apart from each other. The first sealing member 410 and the second sealing member 420 may be coupled so as to press both side surfaces of the first FPCB 430 and/or the second FPCB 440 disposed between the first sealing member 410 and the second sealing member 420.

Figure 6:
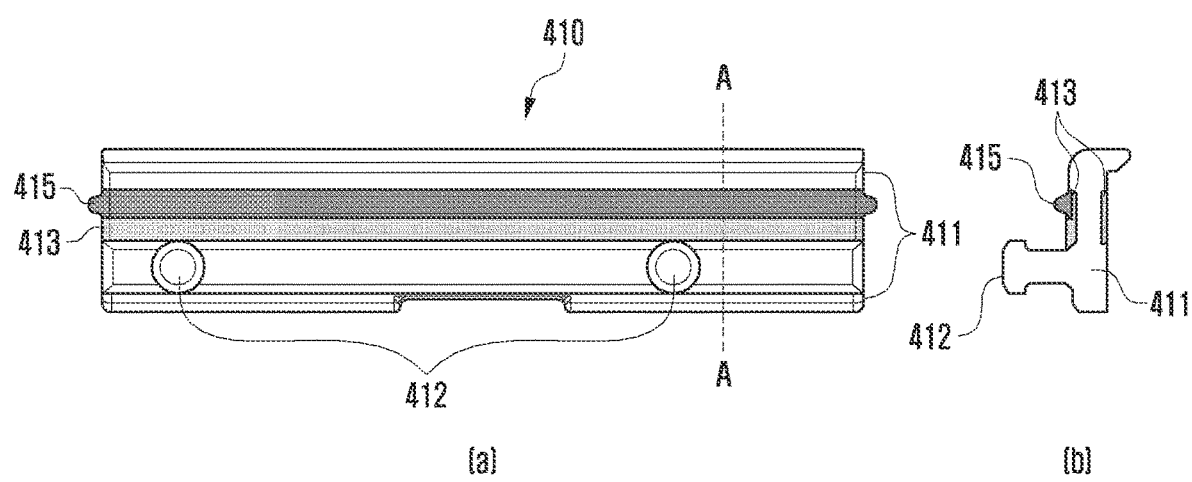
FIG. 6 is a view illustrating a first sealing member according to an embodiment of the disclosure.

FIG. 6 is a view illustrating a first sealing member according to an embodiment of the disclosure. Part (a) of FIG. 6 is a view of the first sealing member 410 viewed in one direction (e.g., negative y-axis direction) in FIG. 5, and part (b) of FIG. 6 is a cross-sectional view of portion A-A in part (a) of FIG. 6.

Referring to parts (a) and (b) of FIG. 6, the first sealing member 410 according to various embodiments of the disclosure may include a body part 411, an elastic part 413, a first packing portion 415, and a first coupling portion 412.

According to an embodiment, the body part 411 may be formed in a substantially vertical shape. The body part 411 may constitute a body (e.g., frame) supporting the first sealing member 410. The body part 411 may be made of a material that provides rigidity to the first sealing member 410. For example, the body part 411 includes at least one of polycarbonate, polyimide, plastic, polymer, or ceramic.

According to an embodiment, the elastic part 413 may be formed to surround a designated portion (e.g., middle portion) of the body part 411. The elastic part 413 may be formed to surround the middle portion of the four side surfaces of the body part 411. The elastic part 413 may be formed to press a first side surface (e.g., y-axis direction) of at least a portion (e.g., vertical portion 435 in FIG. 4A) of the first FPCB 430 and/or the second FPCB 440 disposed in the through hole 450 of the first housing 110. The elastic part 413 may be made of a material different from that of the body part 411. For example, the elastic part 413 is made of a material having elasticity such as rubber or silicone.

According to an embodiment, the first packing portion 415 may be formed to protrude integrally from the elastic part 413. The first packing portion 415 may be formed to protrude from one side surface of the elastic part 413 in one direction (e.g., negative y-axis direction in FIG. 5). The first packing portion 415 may be made of the same material as the elastic part 413.

According to an embodiment, the first coupling portion 412 (e.g., coupling protrusion) may be disposed below the elastic part 413. The first coupling portion 412 may be integrally formed with the body part 411. The first coupling portion 412 may be made of the same material as the body part 411. The first coupling portion 412 may be integrally extended from the body part 411, and may be coupled to a second coupling portion 422 (e.g., coupling groove) formed in the second sealing member 420 in a fitting manner.

According to various embodiments, since the first sealing member 410 and the second sealing member 420 are inserted into the through hole 450 (e.g., first through hole) and/or the through hole 455 (e.g., second through hole), and the first packing portion 415 of the first sealing member 410 and at least one second packing portion 425 of the second sealing member 420 are pressed together, the at least one first coupling portion 412 of the first sealing member 410 may be not formed.

According to an embodiment, the first sealing member 410 may be made of two types of materials, such as the body part 411 and the elastic part 413. In another embodiment, as long as the first sealing member 410 can provide rigidity, the first sealing member 410 may be made of substantially the same single material (e.g., rubber or silicone).

Figure 7:
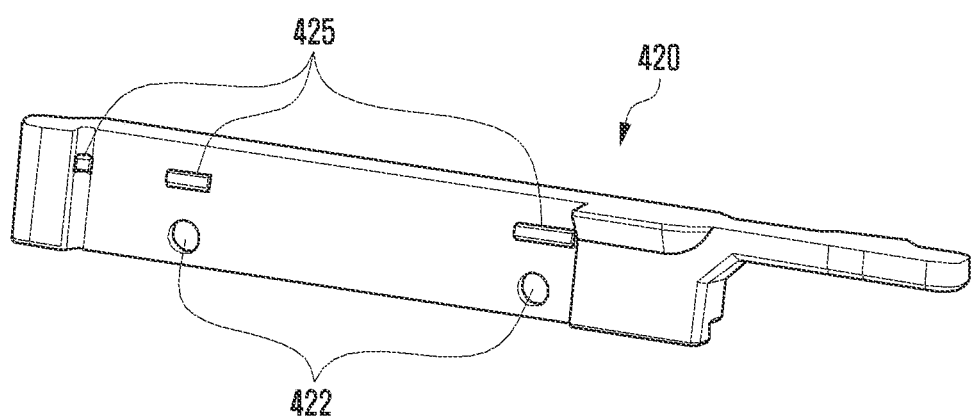
FIG. 7 is a view illustrating a second sealing member according to an embodiment of the disclosure.

FIG. 7 is a view illustrating a second sealing member according to an embodiment of the disclosure.

Referring to FIG. 7, the second sealing member 420 according to various embodiments of the disclosure may include a second coupling portion 422 and at least one second packing portion 425.

According to various embodiments, the second sealing member 420 may be made of a single material. For example, the second sealing member 420 is made of a material having elasticity such as rubber (e.g., waterproof rubber) or silicone.

According to an embodiment, the second coupling portion 422 (e.g., coupling groove) may be formed at a position corresponding to the first coupling portion 412 (e.g., coupling protrusion). The second coupling portion 422 may be coupled to the first coupling portion 412 formed on the first sealing member 410 in a fitting manner.

According to an embodiment, the at least one second packing portion 425 may be formed on at least a portion above the second coupling portion 422 (e.g., coupling groove). When there are plural second packing portions 425, the second packing portions 425 may be formed to protrude from pre-specified regions at preset intervals. For example, the second packing portion 425 is formed to protrude from one side surface of the second sealing member 420 in one direction (e.g., y-axis direction in FIG. 5).

According to an embodiment, the second sealing member 420 may be formed to press a second side surface (e.g., negative y-axis direction) of at least a portion (e.g., vertical portion 435 in FIG. 4A) of the first FPCB 430 and/or the second FPCB 440 disposed in the through hole 450 of the first housing 110.

According to an embodiment, the second packing portion 425 formed on the second sealing member 420 may be disposed at a higher position than the first packing portion 415 formed on the first sealing member 410. According to various embodiments, the first packing portion 415 formed on the first sealing member 410 may be disposed at a higher position than the second packing portion 425 formed on the second sealing member 420. According to various embodiments, the positions of the second packing portion 425 formed on the second sealing member 420 and the first packing portion 415 formed on the first sealing member 410 may be exchanged. For example, the first packing portion 415 formed on the first sealing member 410 is formed on the second sealing member 420, and the second packing portion 425 formed on the second sealing member 420 is formed on the first sealing member 410.

According to various embodiments, as long as the second packing portion 425 formed on the second sealing member 420 and the first packing portion 415 formed on the first sealing member 410 are disposed in a staggered manner to perform a waterproof and/or dustproof function, the position and configuration of the first packing portion 415 and the second packing portion 425 may be variously changed.

According to various embodiments, since the first sealing member 410 and the second sealing member 420 are inserted into the through hole 450 (e.g., first through hole) and/or the through hole 455 (e.g., second through hole), and the first packing portion 415 of the first sealing member 410 and the at least one second packing portion 425 of the second sealing member 420 are pressed together, the at least one second coupling portion 422 of the second sealing member 420 may be not formed.

Figure 8A:
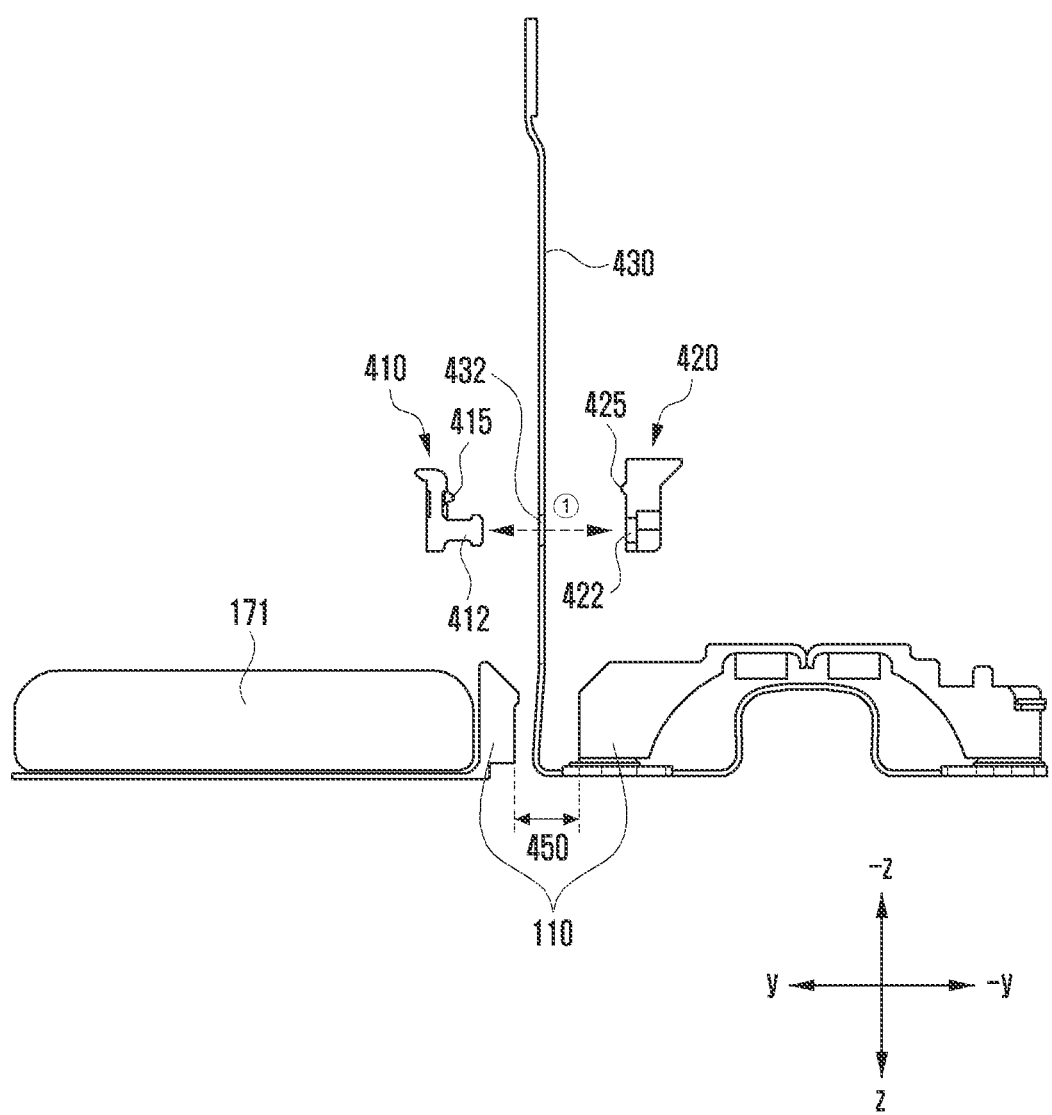
FIG. 8A is a view showing a state before a first sealing member and a second sealing member are coupled according to an embodiment of the disclosure.

FIG. 8A is a view showing a state before a first sealing member and a second sealing member are coupled according to an embodiment of the disclosure.

Figure 8B:
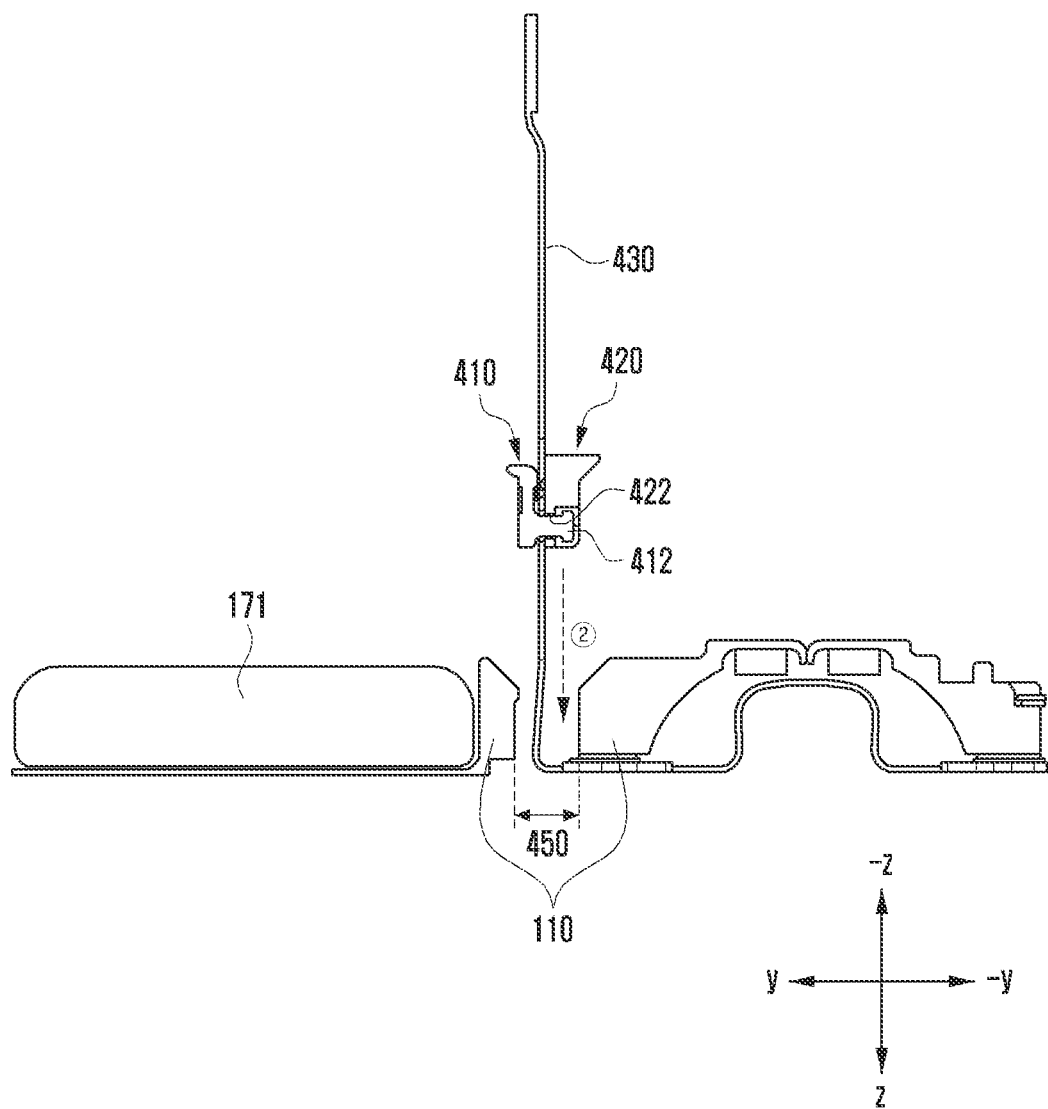
FIG. 8B is a view illustrating an operation in which a first sealing member and a second sealing member are coupled and slid into a through hole of a first housing according to an embodiment of the disclosure.

FIG. 8B is a view illustrating an operation in which a first sealing member and a second sealing member are coupled and slid into a through hole of a first housing according to an embodiment of the disclosure.

Figure 8C:
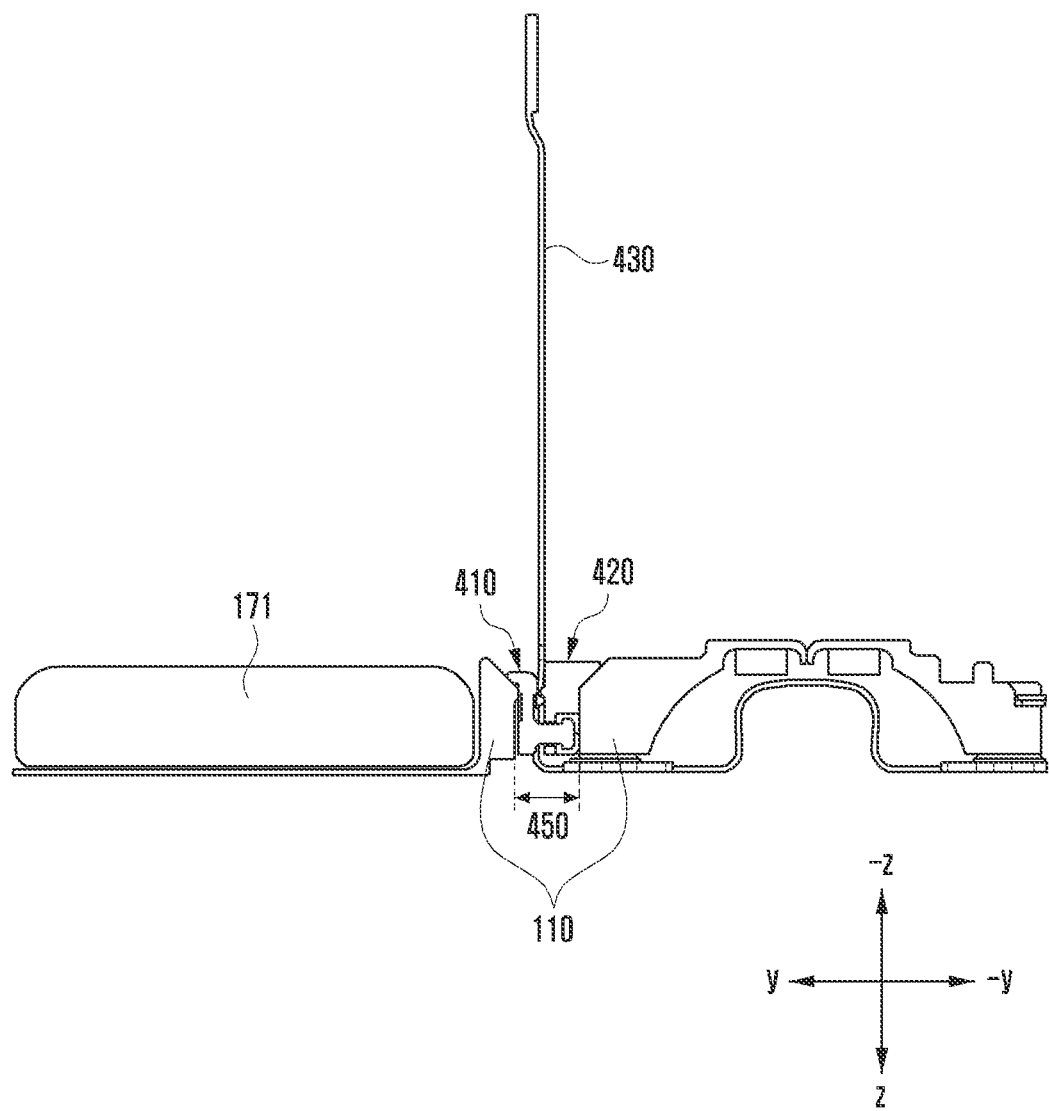
FIG. 8C is a view illustrating a state in which a first sealing member and a second sealing member are coupled and then seated in a through hole of the first housing according to an embodiment of the disclosure.

FIG. 8C is a view illustrating a state in which a first sealing member and a second sealing member are coupled and then seated in a through hole of a first housing according to an embodiment of the disclosure.

Figure 8D:
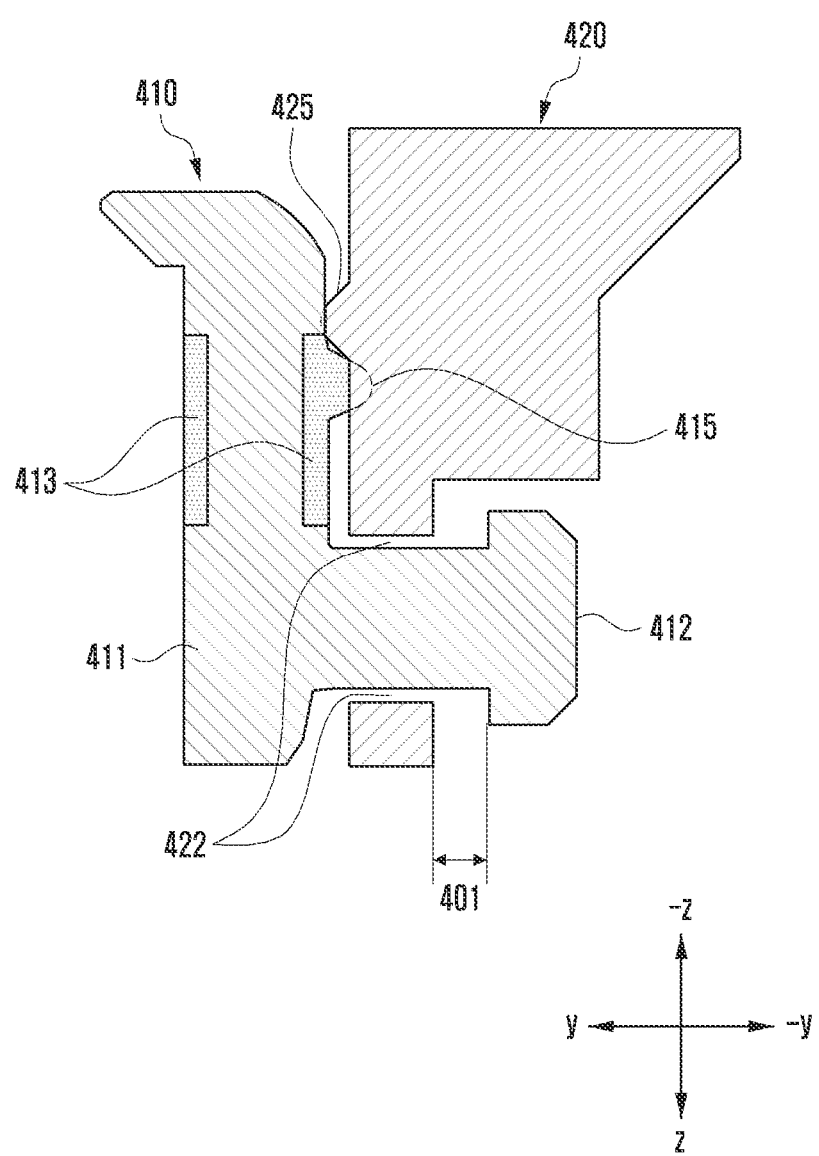
FIG. 8D is an enlarged view illustrating a state in which a first sealing member and a second sealing member are coupled according to an embodiment of the disclosure.

FIG. 8D is an enlarged view illustrating a state in which a first sealing member and a second sealing member are coupled according to an embodiment of the disclosure.

Figure 8E:
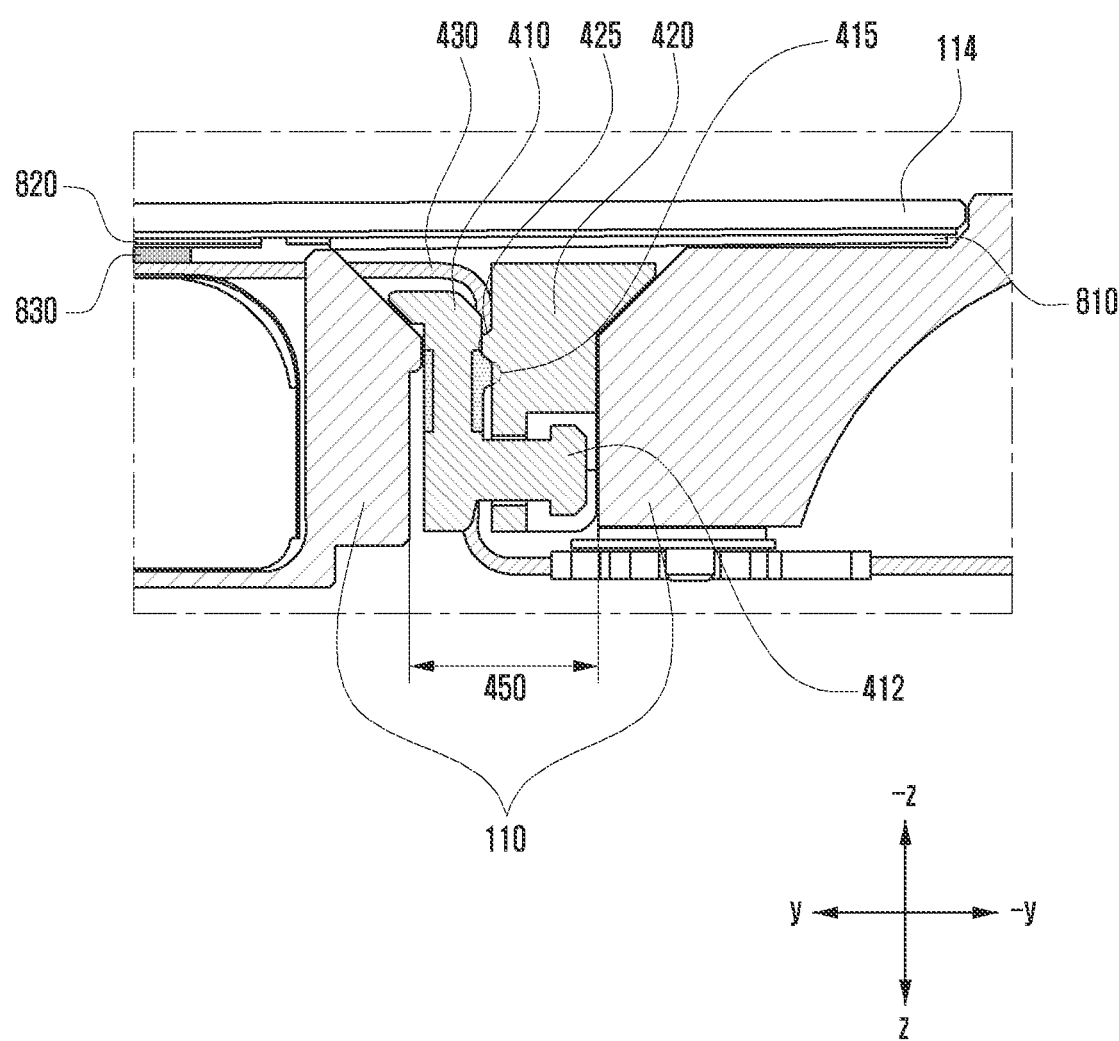
FIG. 8E is a schematic cross-sectional view illustrating a part of an electronic device including a first sealing member, a second sealing member, and a third sealing member according to an embodiment of the disclosure.

FIG. 8E is a schematic cross-sectional view illustrating a part of an electronic device including a first sealing member, a second sealing member, and a third sealing member according to an embodiment of the disclosure.

Referring to FIGS. 8A to 8C, before being bent in one direction (e.g., y-axis direction), at least a section of the first FPCB 430 may be kept upright in a vertical direction (e.g., negative z-axis direction). The description of FIGS. 8A to 8C is focused on the first FPCB 430 as an example, but the same may be applied to the first FPCB 430 and the second FPCB 440.

Referring to FIG. 8A, the first sealing member 410 may be disposed on a first side surface (e.g., y-axis direction) of the first FPCB 430. The second sealing member 420 may be disposed on a second side surface (e.g., negative y-axis direction) of the first FPCB 430. The first sealing member 410 and the second sealing member 420 may be disposed to face each other and coupled together, as indicated by first arrow ①, so as to press both side surfaces (e.g., first side surface and second side surface) of the first FPCB 430 (or, first FPCB 430 and second FPCB 440) disposed between the first sealing member 410 and the second sealing member 420.

According to various embodiments, the first sealing member 410 may include plural first coupling portions 412 (e.g., coupling protrusions) spaced apart at preset intervals. The second sealing member 420 may include plural second coupling portions 422 (e.g., coupling grooves) spaced apart at preset intervals and formed at positions corresponding to the plural first coupling portions 412. The first FPCB 430 may be disposed between the plural first coupling portions 412 and the plural second coupling portions 422.

Referring to FIGS. 8A and 8B, the first sealing member 410 and the second sealing member 420 may be coupled to each other by using the first coupling portion 412 (e.g., coupling protrusion) and the second coupling portion 422 (e.g., coupling groove). The coupled first sealing member 410 and second sealing member 420 may slide in a direction where the through hole 450 of the first housing 110 is formed (e.g., z-axis direction) through a sliding space 432 formed in an outer portion of the first FPCB 430, as indicated by second arrow ②.

Referring to FIG. 8C, after being slid, the first sealing member 410 and the second sealing member 420 may be seated in the through hole 450 formed in the first housing 110. The first sealing member 410 and the second sealing member 420 seated in the through hole 450 may perform waterproofing and/or dustproofing against moisture and/or foreign substances introduced from the outside through the through hole 450.

Referring to FIG. 8D, when the first sealing member 410 and the second sealing member 420 are coupled and seated in the through hole 450 of the first housing 110, the second packing portion 425 formed on the second sealing member 420 may be disposed at a higher position than the first packing portion 415 formed on the first sealing member 410. For example, the second packing portion 425 formed on the second sealing member 420 is disposed in the negative z-axis direction, and the first packing portion 415 formed on the first sealing member 410 may be disposed in the z-axis direction, so they can be coupled to each other in a staggered manner. According to an embodiment, at least some of the second packing portion 425 and at least some of the first packing portion 415 may be pressed together while overlapping each other, for example, by about 0.05 mm to about 0.09 mm.

According to various embodiments, between the first coupling portion 412 (e.g., coupling protrusion) protruding in one direction from one side surface of the first sealing member 410 and the second coupling portion 422 (e.g., coupling groove) formed in the second sealing member 420, the first sealing member 410 and the second sealing member 420 may be formed to have a sliding operation section 401 to slide into the through hole 450 through the first FPCB 430 disposed therebetween.

According to various embodiments, before the first sealing member 410 and the second sealing member 420 are seated in the through hole 450 of the first housing 110, there may be no sliding operation section 401 between the inner surface of the first coupling portion 412 (e.g., coupling protrusion) and the inner surface of the second coupling portion 422 (e.g., coupling groove). For example, before the first sealing member 410 and the second sealing member 420 are seated in the through hole 450 (e.g., when the first sealing member 410 and the second sealing member 420 are at least partially spaced apart), to dispose the first FPCB 430 and/or the second FPCB 440 between the first sealing member 410 and the second sealing member 420, the inner surface of the first coupling portion 412 (e.g., coupling protrusion) and the inner surface of the second coupling portion 422 (e.g., coupling groove) are in contact with each other. According to an embodiment, after the first sealing member 410 and the second sealing member 420 are seated in the through hole 450, as shown in FIG. 8D, a sliding operation section 401 can be formed between the inner surface of the first coupling portion 412 (e.g., coupling protrusion) and the inner surface of the second coupling portion 422 (e.g., coupling groove).

Referring to FIG. 8E, the electronic device 100 according to various embodiments of the disclosure may further include a third sealing member 830.

According to an embodiment, the first sealing member 410 and the second sealing member 420 may be seated in the through hole 450 of the first housing 110. At least some of the first packing portion 415 formed on the first sealing member 410 and at least some of the second packing portion 425 formed on the second sealing member 420 may be coupled to overlap each other.

According to an embodiment, the first rear cover 114 may be disposed on the first side frame 113 (e.g., first side frame 113 in FIG. 3) of the first housing 110. An adhesive member 810 may be disposed between at least some of the first housing 110 and at least some of the first rear cover 114. At least a portion of the first housing 110 and at least a portion of the first rear cover 114 may be adhered by using the adhesive member 810.

According to an embodiment, a protection member 820 may be disposed on at least some of the inner surface of the first rear cover 114. The protection member 820 may prevent the first FPCB 430 from contacting the first rear cover 114 when tension is generated in the first FPCB 430 during folding and unfolding operations of the first housing 110 and the second housing 120. The protection member 820 may include a sponge.

According to an embodiment, the third sealing member 830 may be disposed between the protection member 820 and the first FPCB 430. The third sealing member 830 may be made of a material having elasticity such as rubber (e.g., waterproof rubber) or silicone. The third sealing member 830 may be formed to perform additional waterproofing and/or dustproofing in addition to waterproofing and/or dustproofing by using the first sealing member 410 and the second sealing member 420.

Figure 9A:
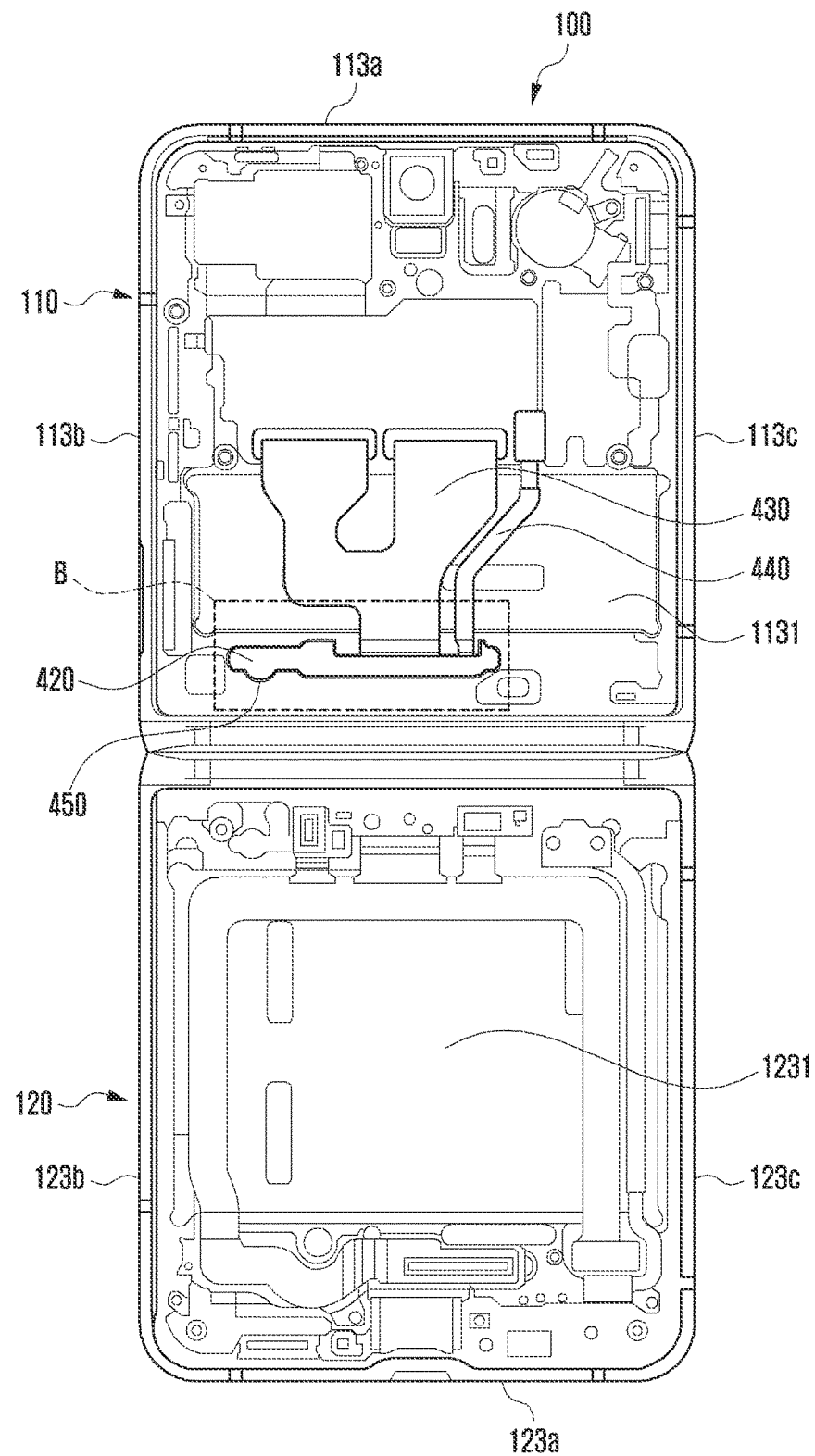
FIG. 9A is a schematic view illustrating a state in which a first FPCB, a second FPCB, a first sealing member, and a second sealing member are disposed in the electronic device according to an embodiment of the disclosure.

FIG. 9A is a schematic view illustrating a state in which a first FPCB, a second FPCB, a first sealing member, and a second sealing member are disposed in an electronic device according to an embodiment of the disclosure.

Figure 9B:
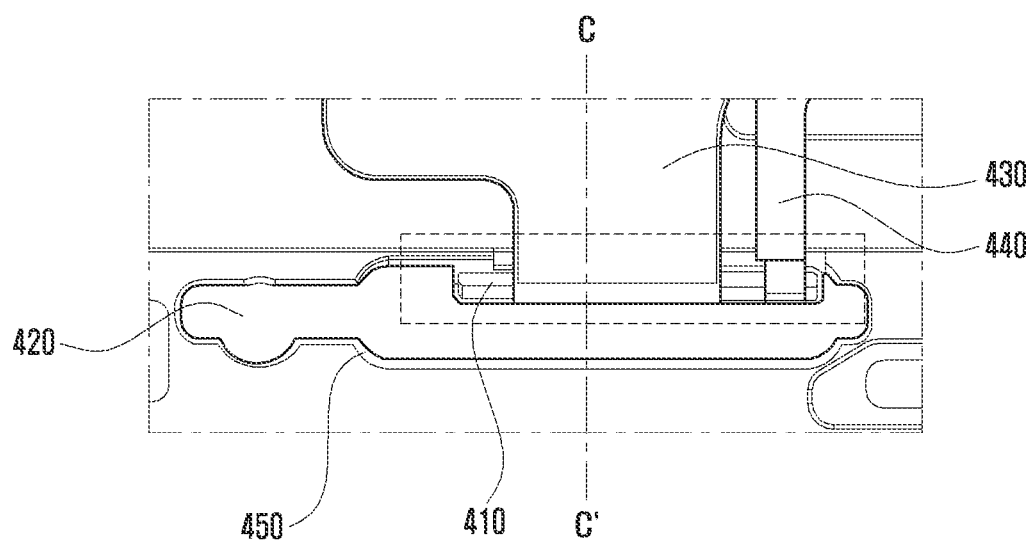
FIG. 9B is an enlarged view of portion 'B' in FIG. 9A according to an embodiment of the disclosure.
Figure 9C:
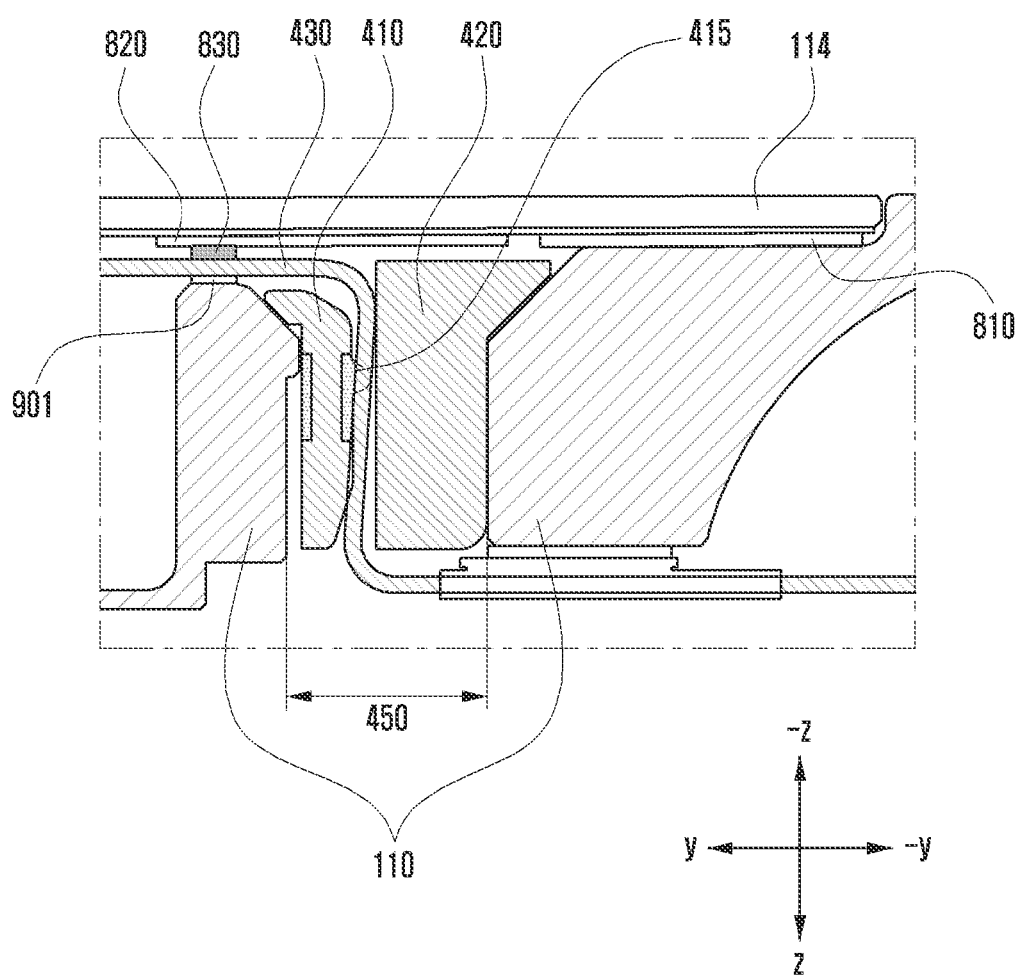
FIG. 9C is a schematic cross-sectional view illustrating configurations around line C-C' in FIG. 9B according to an embodiment of the disclosure.

FIG. 9B is an enlarged view of portion 'B' in FIG. 9A. FIG. 9C is a schematic cross-sectional view illustrating configurations around line C-C' in FIG. 9B according to an embodiment of the disclosure.

Referring to FIGS. 9A and 9B, in the electronic device 100 according to various embodiments of the disclosure, the first FPCB 430 and the second FPCB 440 may be disposed in the through hole 450 of the first housing 110. The first sealing member 410 and the second sealing member 420 may be disposed on both side surfaces of the first FPCB 430 and the second FPCB 440. The first sealing member 410 and the second sealing member 420 may press the first and second side surfaces of the first FPCB 430 and the second FPCB 440 inserted into the through hole 450 (e.g., first through hole) of the first housing 110. For example, the first sealing member 410 and the second sealing member 420 is simultaneously press the first and second side surfaces of the first FPCB 430 and the second FPCB 440 inserted into the through hole 450 (e.g., first through hole) of the first housing 110.

Referring to FIG. 9C, the first sealing member 410 and the second sealing member 420 may be seated in the through hole 450 of the first housing 110. At least some of the first packing portion 415 formed on the first sealing member 410 may overlap and press at least some of the first FPCB 430.

According to an embodiment, the first rear cover 114 may be disposed on the first side frame 113 (e.g., first side frame 113 in FIG. 3) of the first housing 110. At least a portion of the first housing 110 and at least a portion of the first rear cover 114 may be adhered by using the adhesive member 810.

According to an embodiment, the protection member 820 may be disposed on at least some of the inner surface of the first rear cover 114. The protection member 820 may prevent the first FPCB 430 from contacting the first rear cover 114 when tension is generated in the first FPCB 430 during folding and unfolding operations of the first housing 110 and the second housing 120.

According to an embodiment, a portion of the first FPCB 430 and a portion of the first housing 110 may be coupled by using an adhesive 901.

According to an embodiment, the third sealing member 830 may be disposed between the protection member 820 and the first FPCB 430. The third sealing member 830 may be formed to perform additional waterproofing and/or dustproofing in addition to waterproofing and/or dustproofing by using the first sealing member 410 and the second sealing member 420.

Figure 10A:
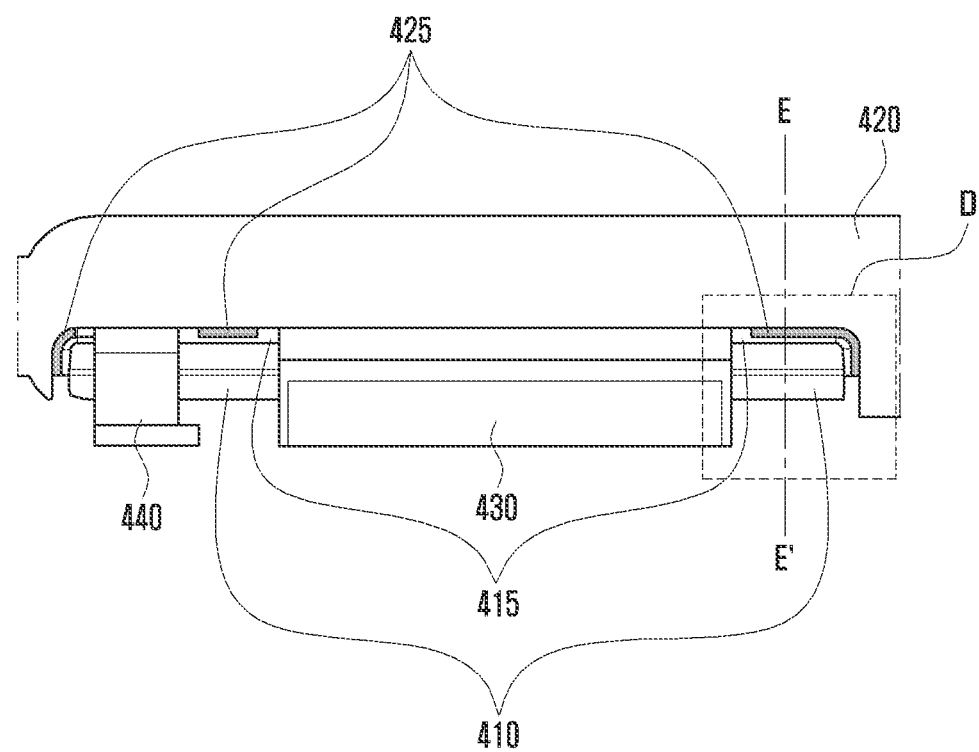
FIG. 10A is a schematic view illustrating a state in which a first FPCB, a second FPCB, a first sealing member, and a second sealing member are coupled in an electronic device according to an embodiment of the disclosure.

FIG. 10A is a schematic view illustrating a state in which a first FPCB, a second FPCB, a first sealing member, and a second sealing member are coupled in the electronic device according to an embodiment of the disclosure.

Figure 10B:
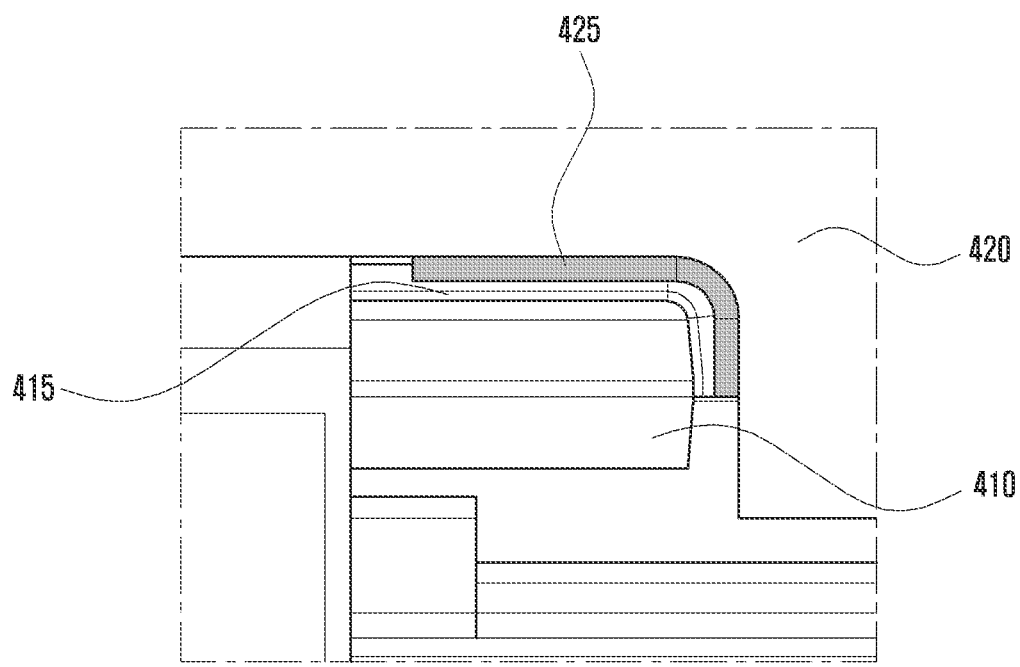
FIG. 10B is an enlarged view of portion 'D' in FIG. 10A according to an embodiment of the disclosure.

FIG. 10B is an enlarged view of portion 'D' in FIG. 10A according to an embodiment of the disclosure.

Figure 10C:
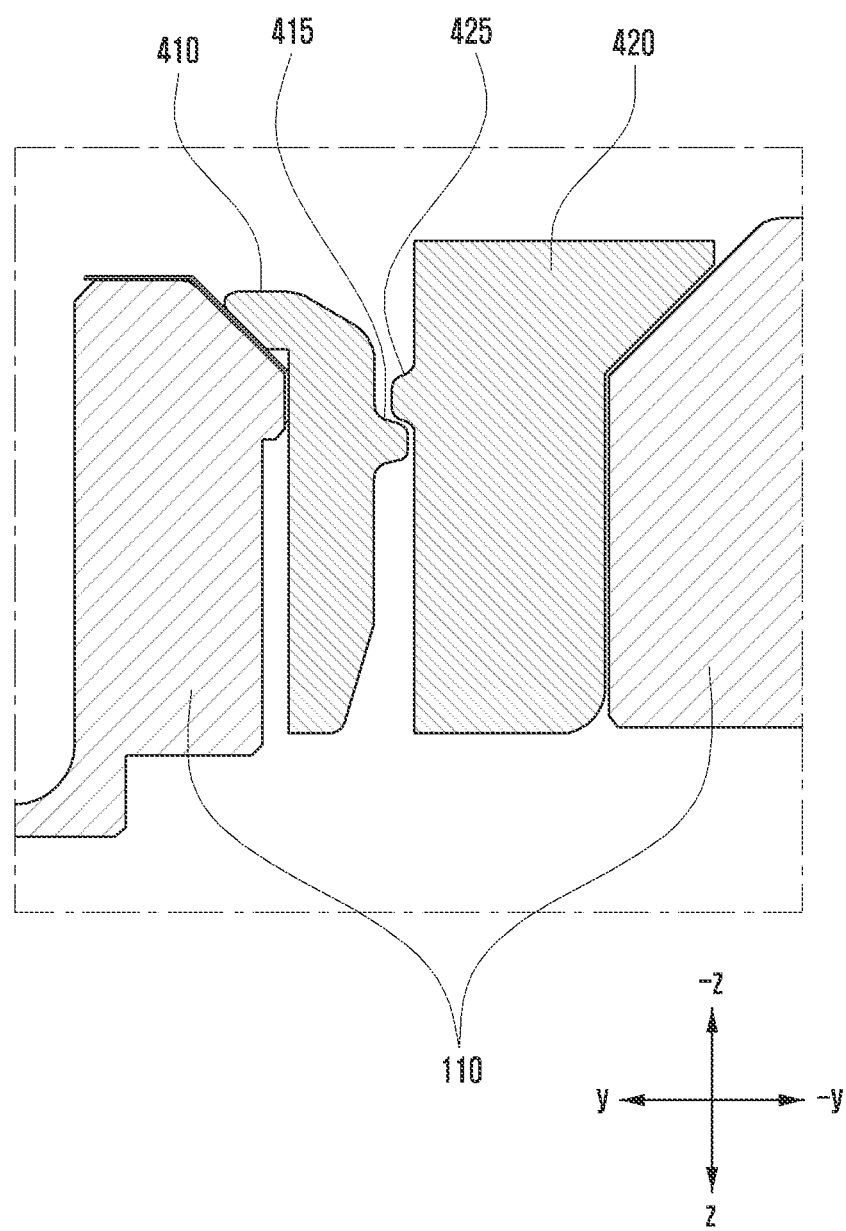
FIG. 10C is a schematic cross-sectional view illustrating portion E-E' in FIG. 10A according to an embodiment of the disclosure.

FIG. 10C is a schematic cross-sectional view illustrating portion E-E' in FIG. 10A according to an embodiment of the disclosure.

Referring to FIGS. 10A to 10C, in the electronic device 100 according to various embodiments of the disclosure, the first FPCB 430 and the second FPCB 440 may be disposed between the first sealing member 410 and the second sealing member 420. The first sealing member 410 and the second sealing member 420 may press both side surfaces (e.g., first side surface and second side surface) of the first FPCB 430 and the second FPCB 440 disposed between the first sealing member 410 and the second sealing member 420. For example, the first sealing member 410 and the second sealing member 420 are simultaneously press both side surfaces (e.g., first side surface and second side surface) of the first FPCB 430 and the second FPCB 440 disposed between the first sealing member 410 and the second sealing member 420.

According to an embodiment, a region of the through hole 450 of the first housing in which the first FPCB 430 and the second FPCB 440 are not arranged may form a diaphragm structure (e.g., waterproof structure) by using the first packing portion 415 of the first sealing member 410 and the second packing portion 425 of the second sealing member 420.

According to an embodiment, the first packing portion 415 may be an extension integrally protruding from the elastic part (e.g., elastic part 413 in FIG. 6) of the first sealing member 410. The second packing portion 425 may be an extension protruding in part from a region of the second sealing member 420.

Referring to FIG. 10C, the first packing portion 415 formed on the first sealing member 410 may be disposed at a lower position than the second packing portion 425 formed on the second sealing member 420. For example, the second packing portion 425 formed on the second sealing member 420 is disposed in the negative z-axis direction, and the first packing portion 415 formed on the first sealing member 410 may be disposed in the z-axis direction, so they may be coupled to each other in a staggered manner. At least some of the first packing portion 415 and at least some of the second packing portion 425 may be pressed together with an overlap (e.g., about 0.05 mm to 0.09 mm).

Figure 11A:
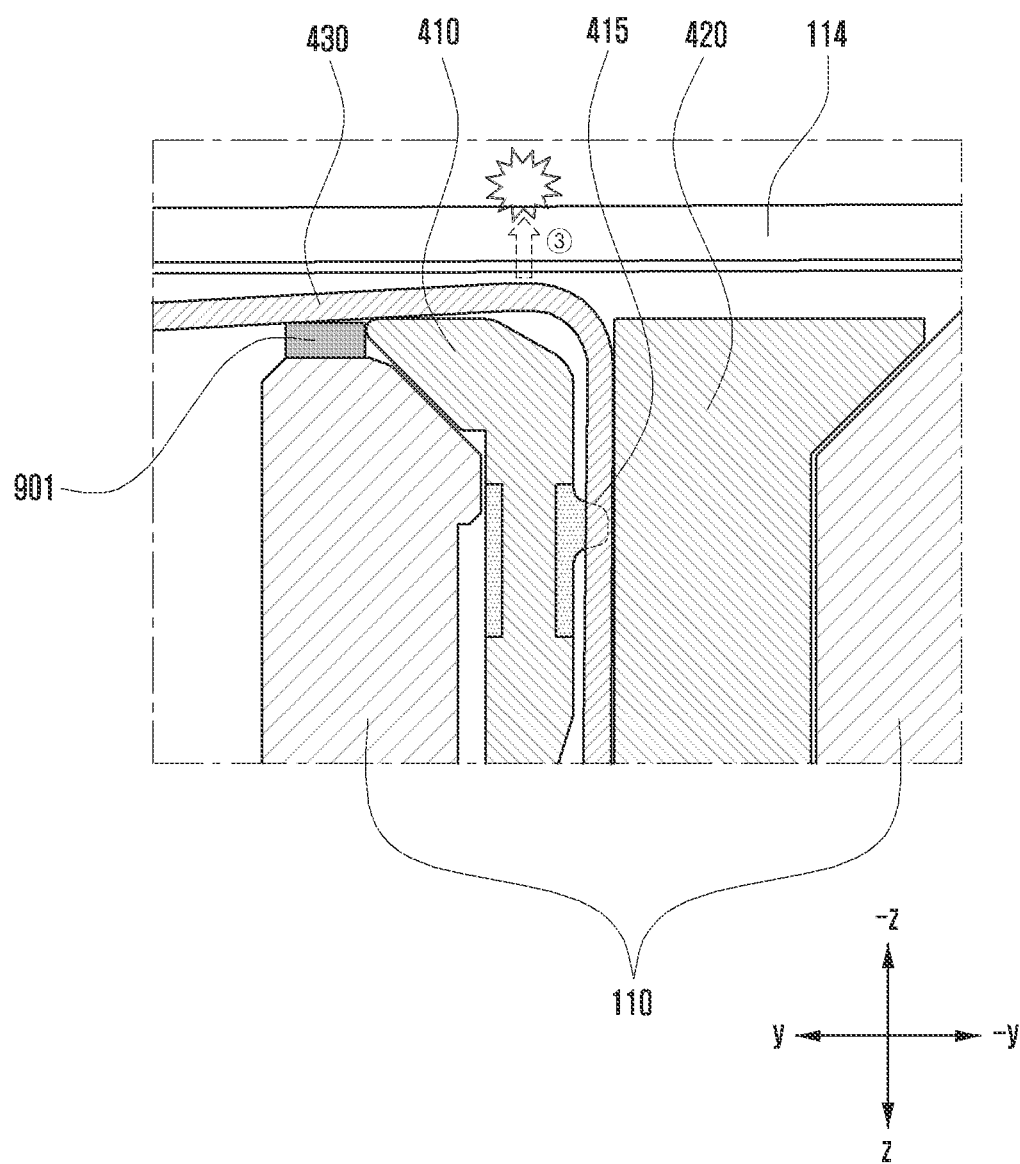
FIG. 11A is a view illustrating deformation of a first FPCB with respect to a first sealing member and a second sealing member in an electronic device according to an embodiment of the disclosure.

FIG. 11A is a view illustrating deformation of a first FPCB with respect to a first sealing member and a second sealing member in an electronic device according to an embodiment of the disclosure.

Figure 11B:
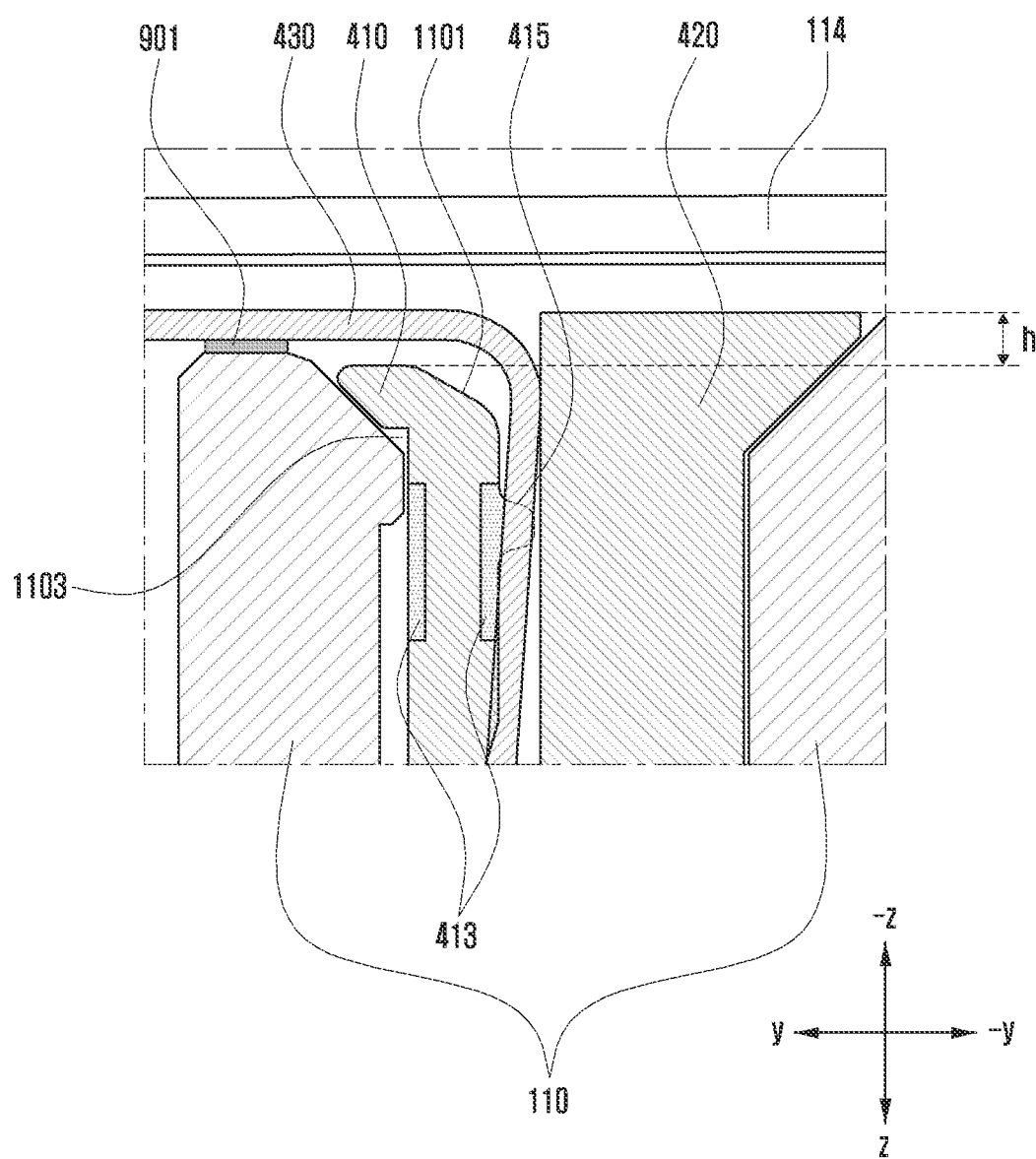
FIG. 11B is a schematic view illustrating some configurations of an electronic device according to an embodiment of the disclosure.

FIG. 11B is a schematic view illustrating some configurations of an electronic device according to an embodiment of the disclosure.

Referring to FIG. 11A, in the electronic device according to a comparative embodiment, the first sealing member 410 and the second sealing member 420 may be formed to have substantially the same height. When the first sealing member 410 and the second sealing member 420 have substantially the same height, tension may be generated in at least a portion of the first FPCB 430 and/or the second FPCB 440 during folding and unfolding operations of the first housing 110 and the second housing 120.

According to an embodiment, when tension is generated in at least a portion of the first FPCB 430 in the negative z-axis direction as indicated by third arrow ③, a portion of the first FPCB 430 may be deformed to contact the first rear cover 114. When a portion of the first FPCB 430 comes into contact with the first rear cover 114, the portion of the first FPCB 430 may be pressed by the first rear cover 114. If a portion of the first FPCB 430 is in contact with the first rear cover 114 for a long time, a portion of the first rear cover 114 may be separated from the first housing 110.

Referring to FIG. 11B, in the electronic device 100 according to various embodiments of the disclosure, the first sealing member 410 and the second sealing member 420 may be different in height h. The first sealing member 410 and the second sealing member 420 may be formed to have different heights h with a step difference. For example, as the first FPCB 430 and/or the second FPCB 440 are disposed above the first sealing member 410, the height of the first sealing member 410 is formed to be lower than that of the second sealing member 420.

According to an embodiment, the first sealing member 410 may be formed to be lower than the height of the second sealing member 420 (e.g., z-axis direction). The second sealing member 420 may be formed to be higher than the height of the first sealing member 410 (e.g., negative z-axis direction). A portion of the first FPCB 430 and/or the second FPCB 440 and a portion of the first housing 110 may be coupled by using an adhesive 901. The height of the second sealing member 420 may be substantially the same as that of the first FPCB 430 and/or the second FPCB 440 disposed above the first sealing member 410.

According to an embodiment, a portion of the upper end of the first sealing member 410 may include an inclined surface 1101 (e.g., chamfer). The inclined surface 1101 may prevent the inner surface of the bent portion of the first FPCB 430 and/or the second FPCB 440 from contacting a portion of the upper end of the first sealing member 410. The inclined surface 1101 may reduce bending stress of the first FPCB 430.

According to an embodiment, a gap 1103 may be included between a portion of a side surface of the first sealing member 410 and a portion of the first housing 110. The gap 1103 may prevent the first sealing member 410 from moving in a specific direction when a portion of the first housing 110 contacts a portion of the first sealing member 410 due to folding and unfolding operations of the first housing 110 and the second housing 120.

According to various embodiments, the gap 1103 may be formed to prevent interference with a part of the first housing 110 when the first sealing member 410 is assembled, regardless of folding and unfolding operations of the first housing 110 and the second housing 120. For example, if the gap 1103 is not formed between a portion of the side surface of the first sealing member 410 and a portion of the first housing 110, the edges of a part of the first sealing member 410 and a part of the first housing 110 does not exactly match, and the first sealing member 410 is not positioned properly. According to an embodiment, the gap 1103 may be formed such that a portion of the side surface of the first sealing member 410 and a portion of the first housing 110 do not contact each other due to the part tolerance and/or assembly tolerance for a portion of the side surface of the first sealing member 410 and a portion of the first housing 110.

According to an embodiment, at least a portion of the elastic part 413 formed on one side surface of the first sealing member 410 may be coupled to a portion of the inner surface of the through hole (e.g., through hole 450 in FIGS. 8A to 8E) of the first housing 110. At least a portion of the elastic part 413 and the first packing portion 415 formed on the other side surface of the first sealing member 410 may be coupled to one side surface of the first FPCB 430. At least a portion of one side surface of the second sealing member 420 may be coupled to at least a portion of the other side surface of the first FPCB 430 and/or the second FPCB 440.

As described above, various embodiments of the disclosure may use the first sealing member 410 and the second sealing member 420 to press both side surfaces of the first FPCB 430 and/or the second FPCB 440 disposed in the through hole 450 formed adjacent to the folding axis (e.g., A-axis) of the first housing 110 and/or the second housing 120, so that waterproofing and/or dustproofing can be performed against moisture and/or foreign substances introduced from the outside of the electronic device 100.

An electronic device 100 according to various embodiments of the disclosure may include: a hinge module 140; a first housing 110 coupled at least in part to a first side of the hinge module 140 and including a first substrate assembly 161; a second housing 120 coupled at least in part to a second side of the hinge module 140, including a second substrate assembly 162, and formed to be folded and unfolded with respect to the first housing 110 by using the hinge module 140; a flexible display 130 supported by upper portions of the first housing 110 and the second housing 120 and configured to be folded and unfolded; at least one FPCB 430 or 440 electrically connecting the first substrate assembly 161 and the second substrate assembly 162; a through hole 450 (e.g., first through hole) formed in the first housing 110 to form a path through which the at least one FPCB 430 or 440 passes; a first sealing member 410 disposed to press a first side surface of the at least one FPCB 430 or 440 disposed in the through hole 450; and a second sealing member 420 disposed to press a second side surface of the at least one FPCB 430 or 440 disposed in the through hole 450.

According to various embodiments, the first sealing member 410 may include at least one first coupling portion 412 formed to protrude from one side surface; the second sealing member 420 may include at least one second coupling portion 422 formed at a position corresponding to the at least one first coupling portion 412; the at least one first coupling portion 412 and the at least one second coupling portion 422 may be coupled via interference fitting.

According to various embodiments, the first sealing member 410 may include a body part 411 constituting a body of the first sealing member 410, an elastic part 413 surrounding a specified portion of the body part 411, and a first packing portion 415 formed to protrude from one side surface of the elastic part 413.

According to various embodiments, a region of the through hole 450 of the first housing 110 where the at least one FPCB 430 or 440 is not disposed may be formed to constitute a diaphragm structure by using the first packing portion 415 formed to protrude from the first sealing member 410 and the second packing portion 425 formed to protrude from the second sealing member 420.

According to various embodiments, the at least one FPCB 430 or 440 may be disposed on the first sealing member 410, and the first sealing member 410 may have a lower height than the second sealing member 420.

According to various embodiments, the body part 411 and the elastic part 413 may be made of different materials or may be made of substantially the same material.

According to various embodiments, the body part 411 may be made of one of polycarbonate, polyimide, plastic, polymer, and ceramic, and the elastic part 413 may be made of one of rubber and silicone.

According to various embodiments, the second sealing member 420 may include a second packing portion 425 made of one of rubber and silicone and formed to protrude from a specified position of the second sealing member 420 at a preset interval.

According to various embodiments, the first packing portion 415 formed on the first sealing member 410 and the second packing portion 425 formed on the second sealing member 420 are disposed at different positions, and some of the first packing portion 415 and some of the second packing portion 425 may be coupled to overlap each other.

According to various embodiments, the first sealing member 410 and the second sealing member 420 may be coupled using the first coupling portion 412 and the second coupling portion 422 in a state where the at least one FPCB 430 or 440 is kept upright in a substantially vertical direction, and the coupled first sealing member 410 and second sealing member 420 may be slid through the at least one FPCB 430 or 440 and be seated in the through hole 450 of the first housing 110.

According to various embodiments, the first housing 110 may include a first rear cover 114 disposed on a first side frame 113 and a protection member 820 disposed on at least a portion of an inner surface of the first rear cover 114; at least a portion of the first housing 110 and at least a portion of the first rear cover 114 may be adhered by using an adhesive member 810; a third sealing member 830 may be disposed between the protection member 820 and the at least one FPCB 430 or 440.

According to various embodiments, a portion of the at least one FPCB 430 or 440 and a portion of the first housing 110 may be coupled by using an adhesive 901.

According to various embodiments, a portion of the upper end of the first sealing member 410 may include an inclined surface 1101, and the inclined surface 1101 may be formed such that the inner surface of a bent portion of the at least one FPCB 430 or 440 does not contact a portion of the upper end of the first sealing member 410.

According to various embodiments, a gap 1103 may be included between a portion of the side surface of the first sealing member 410 and a portion of the first housing 110; the gap 1103 may be formed such that a portion of the first housing 110 does not contact a portion of the first sealing member 410 during folding and unfolding operations of the first housing 110 and the second housing 120.

According to various embodiments, the first sealing member 410 may include an elastic part 413 formed on one side surface; at least a portion of the elastic part 413 may be coupled to at least a portion of the inner surface of the through hole 450 formed in the first housing 110; at least a portion of one side surface of the second sealing member 420 may be coupled to at least a portion of the other side surface of the at least one FPCB 430 or 440.

An electronic device 100 according to various embodiments of the disclosure may include: a hinge module 140; a first housing 110 coupled at least in part to a first side of the hinge module 140 and including a first substrate assembly 161; a second housing 120 coupled at least in part to a second side of the hinge module 140, including a second substrate assembly 162, and formed to be folded and unfolded with respect to the first housing 110 by using the hinge module 140; a flexible display 130 supported by upper portions of the first housing 110 and the second housing 120 and configured to be folded and unfolded; at least one FPCB 430 or 440 electrically connecting the first substrate assembly 161 and the second substrate assembly 162; a through hole 450 (e.g., first through hole) formed in the first housing 110 to form a path through which the at least one FPCB 430 or 440 passes; a first sealing member 410 disposed to press a first side surface of the at least one FPCB 430 or 440 disposed in the through hole 450; and a second sealing member 420 disposed to press a second side surface of the at least one FPCB 430 or 440 disposed in the through hole 450, wherein the first sealing member 410 may include a first packing portion 415 formed to protrude from one side surface, the second sealing member 420 may include a second packing portion 425 formed to protrude from a specified position at a preset interval, and some of the first packing portion 415 and some of the second packing portion 425 may be coupled to overlap each other inside the through hole 450.

According to various embodiments, the first sealing member 410 may include at least one first coupling portion 412 formed to protrude from one side surface; the second sealing member 420 may include at least one second coupling portion 422 formed at a position corresponding to the at least one first coupling portion 412; the at least one first coupling portion 412 and the at least one second coupling portion 422 may be coupled via interference fitting.

According to various embodiments, the first housing 110 may include a first rear cover 114 disposed on a first side frame 113 and a protection member 820 disposed on at least a portion of an inner surface of the first rear cover 114; at least a portion of the first housing 110 and at least a portion of the first rear cover 114 may be adhered by using an adhesive member 810; a third sealing member 830 may be disposed between the protection member 820 and the at least one FPCB 430 or 440.

According to various embodiments, the at least one FPCB 430 or 440 may be disposed above the first sealing member 410, and the height of the first sealing member 410 may be formed to be lower than that of the second sealing member 420.

According to various embodiments, a portion of the upper end of the first sealing member 410 may include an inclined surface 1101, and the inclined surface 1101 may be formed such that the inner surface of a bent portion of the at least one FPCB 430 or 440 does not contact a portion of the upper end of the first sealing member 410.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a hinge module;
a first housing coupled at least in part to a first side of the hinge module, the first housing including a first substrate assembly;
a second housing coupled at least in part to a second side of the hinge module, the second housing including a second substrate assembly, and the second housing formed to be folded and unfolded with respect to the first housing by using the hinge module;
a flexible display supported by upper portions of the first housing and the second housing, the flexible display configured to be folded and unfolded;
at least one flexible printed circuit board (FPCB) electrically connecting the first substrate assembly and the second substrate assembly;
a through hole formed in the first housing to form a path through which the at least one FPCB passes;
a first sealing member disposed to press a first side surface of the at least one FPCB disposed in the through hole; and
a second sealing member disposed to press a second side surface of the at least one FPCB disposed in the through hole,
wherein the first sealing member comprises at least one first coupling portion formed to protrude from one side surface,
wherein the second sealing member comprises at least one second coupling portion formed at a position corresponding to the at least one first coupling portion, and
wherein the at least one first coupling portion and the at least one second coupling portion are coupled via interference fitting.

2. The electronic device of claim 1, wherein the first sealing member comprises:
a body part constituting a body of the first sealing member;
an elastic part surrounding a specified portion of the body part; and
a first packing portion formed to protrude from one side surface of the elastic part.

3. The electronic device of claim 1, wherein a region of the through hole of the first housing where the at least one FPCB is not disposed is formed to constitute a diaphragm structure by using a first packing portion formed to protrude from the first sealing member and a second packing portion formed to protrude from the second sealing member.

4. The electronic device of claim 1,
wherein the at least one FPCB is disposed above the first sealing member, and
wherein a height of the first sealing member is formed to be lower than that of the second sealing member.

5. The electronic device of claim 2, wherein the body part and the elastic part are made of different materials or are made of substantially the same material.

6. The electronic device of claim 2,
wherein the body part is made of one of polycarbonate, polyimide, plastic, polymer, or ceramic, and
wherein the elastic part is made of one of rubber and silicone.

7. The electronic device of claim 2,
wherein the second sealing member comprises a second packing portion made of one of rubber and silicone, and
wherein the second packing portion is formed to protrude from a specified position of the second sealing member at a preset interval.

8. The electronic device of claim 7,
wherein the first packing portion formed on the first sealing member and the second packing portion formed on the second sealing member are disposed at different positions, and
wherein some of the first packing portion and some of the second packing portion are coupled to overlap each other.

9. The electronic device of claim 1,
wherein the first sealing member and the second sealing member are coupled using the first coupling portion and the second coupling portion in a state where the at least one FPCB is kept upright in a substantially vertical direction, and wherein the coupled first sealing member and second sealing member are slid through the at least one FPCB and are seated in the through hole of the first housing.

10. The electronic device of claim 1, wherein the first housing includes a first rear cover disposed on a first side frame, and a protection member disposed on at least a portion of an inner surface of the first rear cover, wherein at least a portion of the first housing and at least a portion of the first rear cover are adhered by using an adhesive member, and wherein a third sealing member is disposed between the protection member and the at least one FPCB.

11. The electronic device of claim 4, wherein a portion of the at least one FPCB and a portion of the first housing are coupled by using an adhesive.

12. The electronic device of claim 1, wherein a portion of an upper end of the first sealing member includes an inclined surface, and wherein the inclined surface is formed in a manner that an inner surface of a bent portion of the at least one FPCB does not contact a portion of the upper end of the first sealing member.

13. The electronic device of claim 1, wherein a gap is included between a portion of the side surface of the first sealing member and a portion of the first housing, and wherein the gap is formed in a manner that a portion of the first housing does not contact a portion of the first sealing member during folding and unfolding operations of the first housing and the second housing.

14. The electronic device of claim 1, wherein the first sealing member includes an elastic part formed on one side surface, wherein at least a portion of the elastic part is coupled to at least a portion of an inner surface of the through hole formed in the first housing, and wherein at least a portion of one side surface of the second sealing member is coupled to at least a portion of the other side surface of the at least one FPCB.

\* \* \* \* \*